United States Patent [19]

Amazawa et al.

[11] Patent Number: 4,956,204
[45] Date of Patent: Sep. 11, 1990

[54] PROCESS OF FORMING A FILM BY LOW PRESSURE CHEMICAL VAPOR DEPOSITION

[75] Inventors: Takao Amazawa, Atsugi; Hiroaki Nakamura, Fujisawa, both of Japan

[73] Assignee: Nippon Telegraph and Telephone Corporation, Japan

[21] Appl. No.: 324,983

[22] Filed: Mar. 15, 1989

Related U.S. Application Data

[63] Continuation of Ser. No. 84,513, Aug. 11, 1987, abandoned.

[30] Foreign Application Priority Data

Aug. 15, 1986 [JP] Japan ................................ 61-190494
May 15, 1987 [JP] Japan ................................ 62-118147

[51] Int. Cl.$^5$ .............................................. C23C 16/00
[52] U.S. Cl. ............................. 427/248.1; 118/725;
427/252; 427/253; 427/255; 427/255.2;
427/299
[58] Field of Search ................ 427/248.1, 252, 253,
427/255, 255.2, 299; 118/725

[56] References Cited

U.S. PATENT DOCUMENTS

| | | | |
|---|---|---|---|
| 4,328,261 | 5/1982 | Heinecke et al. | 427/252 |
| 4,438,723 | 3/1984 | Cannella et al. | 118/725 |
| 4,447,469 | 5/1984 | Peters | 427/255.2 |
| 4,503,807 | 3/1985 | Nakayama et al. | 118/719 |
| 4,526,806 | 7/1985 | Haque et al. | 427/255.2 |
| 4,599,244 | 7/1986 | Falckenberg et al. | 118/725 |
| 4,599,245 | 7/1986 | Falckenberg et al. | 118/725 |
| 4,625,678 | 12/1986 | Shioya et al. | 118/725 |
| 4,649,024 | 3/1987 | Brock et al. | 427/255.2 |
| 4,650,698 | 3/1987 | Moriya et al. | 427/255.2 |
| 4,654,228 | 3/1987 | Komiyama | 427/255.2 |
| 4,684,542 | 8/1987 | Jasinski | 427/255.2 |

OTHER PUBLICATIONS

Condensation and Evaporation (Nucleation and Growth Kinetics) pp. 15-28 by J. P. Hirth et al., Macmillan New York 1963.
"The Nucleation of CVD Silicon on $SiO_2$ and $Si_3N_4$ Substrates" by W. A. P. Claassen, J. Electrochem. Soc.: Solid-State Science and Technology, Jan. 1980.
"Characterization of LPCVD Aluminum for VLSI Processing", by R. A. Levy et al., J. Electrochem. Soc.: Solid-State Science and Technology, pp. 2175-2182, Sep. 1984.

*Primary Examiner*—Norman Morgenstern
*Assistant Examiner*—Sadie Childs
*Attorney, Agent, or Firm*—Samuels, Gauthier & Stevens

[57] ABSTRACT

A chemical vapor deposition method is characterized in that a heating block and a surface to be deposited of a substrate are arranged to face to each other at a given distance in a closed space, a source gas is guided into the closed space and supplied between the heating block and the substrate, thereby depositing a thin film on the surface to be deposited of the substrate. A chemical vapor deposition apparatus includes a heating block arranged in a closed space, a substrate holder for holding a substrate so that a surface to be deposited of the substrate is arranged to face to the heating block at a given distance, and a device for guiding a source gas to the closed space. In this CVD apparatus, the source gas guided by the device is guided to the closed space and supplied between the heating block and the substrate, thereby depositing a thin film on the surface to be deposited of the substrate.

10 Claims, 13 Drawing Sheets

5μm

5μm

5μm

10μm

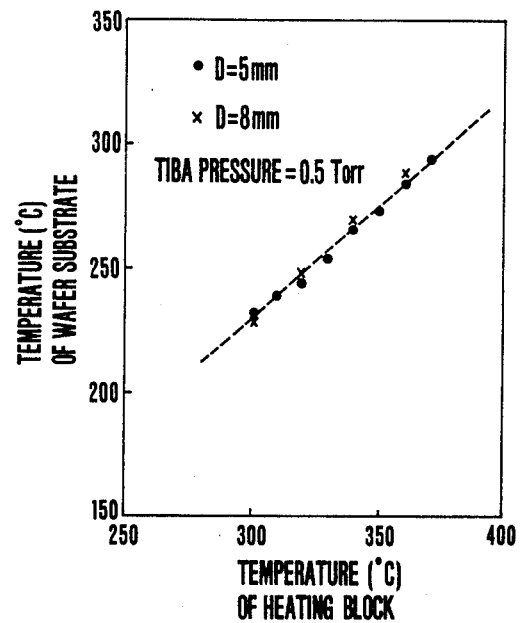
FIG.5
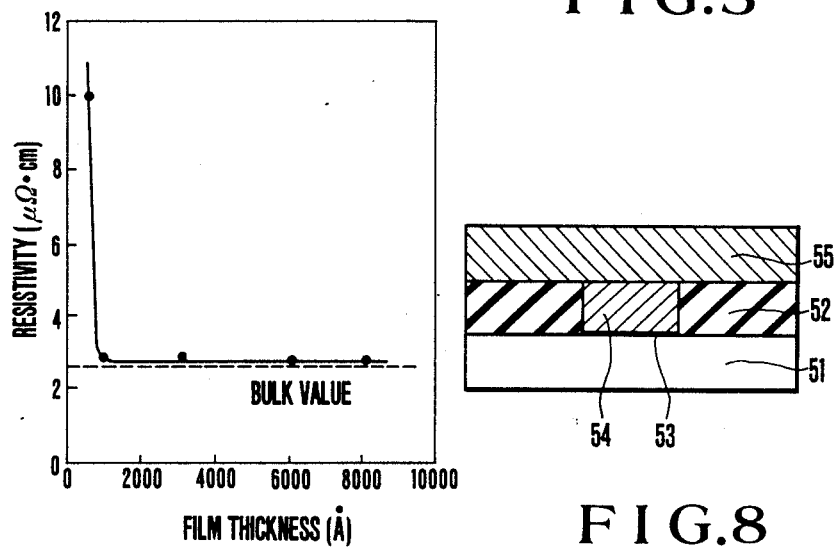
FIG.7
FIG.8

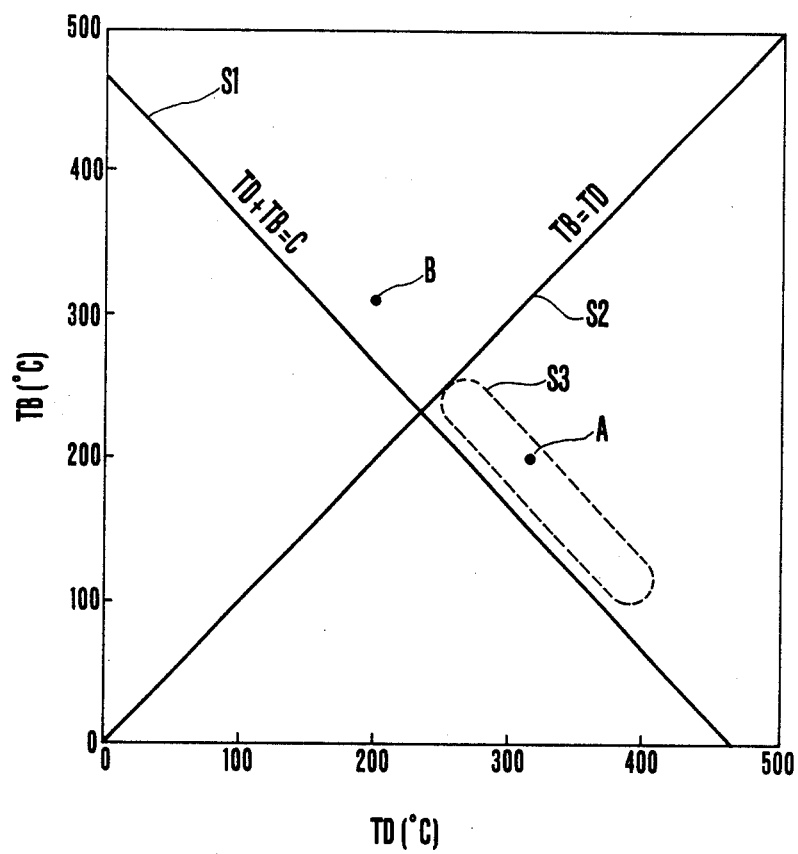
F I G. 16

5000Å

5000Å

5000Å

5000Å

5000Å

5000Å

5000Å

5000Å

PROCESS OF FORMING A FILM BY LOW PRESSURE CHEMICAL VAPOR DEPOSITION

This is a continuation of co-pending application, Ser. No. 07/084,513 filed on Aug. 11, 1987 now abandoned.

BACKGROUND OF THE INVENTION

The present invention relates to a chemical vapor deposition method of forming a thin film on a substrate and an apparatus therefor.

Chemical Vapor Deposition (to be referred to as "CVD" hereinafter) is a method of depositing a thin film on a substrate using a chemical reaction and is one of known thin film formation methods such as vacuum evaporation or sputtering. Especially in a manufacturing process of a semiconductor integrated circuit device, CVD is widely used to form a silicon dioxide film or a polycrystalline silicon thin film. CVD is classified into various types in accordance with a heating method, as gas pressure, or a chemical reaction. For example, conventional known CVD methods are: a cold wall type in which only a deposition substrate is heated; a hot wall type in which an entire reaction chamber is heated; atmospheric CVD in which reaction occurs in an atmospheric pressure; low-pressure CVD in which reaction occurs at a low pressure; and plasma CVD and photo CVD in addition to conventional CVD which uses heat to cause chemical reaction.

The characteristics of CVD as a thin film formation means are such that a thin film with good step coverage can be formed on a substrate having projections, that a composition ratio of a thin film can be arbitrarily controlled, and that a thin film can be formed without contamination or damaging a substrate.

However, CVD has drawbacks as compared with vacuum evaporation or sputtering. First, a temperature of a thin film deposition substrate is limited by a reaction temperature of a gas, so that a substrate temperature cannot be arbitrarily changed For this reason, various problems are posed in CVD, especially in normal CVD using heat.

In CVD, a temperature at which deposition progresses at a sufficiently high rate by chemical reaction of a source gas is not always a temperature most suitable for crystal growth of a thin film. A reaction temperature of a source gas in CVD is normally much higher than a substrate temperature in another formation method such as vacuum evaporation or sputtering. When a thin film is deposited on a substrate at a high substrate temperature in a manufacturing process of a semiconductor IC, diffusion or reaction progresses between a deposited film and a substrate or between different materials of a substrate, often resulting in serious degradation in device characteristics.

In thermal CVD, selective growth can be performed utilizing a difference between surface materials of a substrate, i.e., a thin film can be deposited only on a pattern of a specific material of a substrate surface but not on the other material. However, when the substrate temperature is increased, selectivity is decreased by the reason to be described later, so that selective growth cannot be performed well.

In addition, when an alloy film of aluminum and silicon is deposited using two or more source gases, reaction temperatures of which are largely different from each other, such as triisobutyl aluminum gas and silane gas, it is difficult for conventional thermal CVD to mix silicon into aluminum at a low reaction temperature at which the surface of a deposited thin film is smoothed.

As one of methods of preventing the above problem, a plasma CVD method or a photo CVD method which promotes reaction using energy other than heat such as plasma or light has been receiving a great deal of attention. In these CVD methods, although the substrate temperature can be decreased as low as that of vacuum evaporation or sputtering, film quality is degraded or a film is damaged, so that many characteristics of the CVD method are sacrificed. In addition, it is difficult to perform selective growth when another energy such as plasma is used.

The second drawback of CVD is that surface roughness tends to be enlarged. This problem is posed when a crystalline thin film such as a metal film is deposited by thermal CVD. The degree of roughness is normally increased when a surface free energy of a thin film material is high and a substrate temperature is also high. This will be explained as follows in accordance with the nucleus growth theory using a surface free energy model by Volmer et al. Note that a reference is "J.P. Hirth and G.M. Pound: Condensation and Evaporation (Macmillan, New York, 1963)".

Atoms reaching the substrate repeat collision and reevaporation and become an aggregate called a cluster in which atoms of a predetermined number or more are bonded with each other. A total free energy G of one cluster is a sum of a change in a free energy during condensation from a gas and a surface free energy of a formed cluster, and is represented as follows:

$$G = (\sigma_0 \cdot 4\pi r^2 + g_v \cdot 4\pi r^3/3) \cdot f(\theta) \tag{1}$$

Where:
- r: a radius of curvature
- $\theta$: a contact angle of a cluster with respect to a substrate
- $f(\theta) = (2 - 3\cos\theta + \cos^3\theta)/4$: a volume factor of a cluster
- $\sigma_0$: a surface free energy between a gaseous phase and a cluster per unit volume area
- $g_v$: a change in free energy per unit volume when a phase changes from gaseous phase to liquid phase, which is normally negative. Assuming that a equilibrium vapor pressure is $p_e$, an actual vapor pressure is p, a molecular volume of the gas is $\Omega$, the Boltzmann constant is k, and the absolute temperature is T, it is represented by $g_v = -(kT/\Omega)\ln(p/p_e)$ where $p/p_e$ is the degree of supersaturation.

When r which gives the maximum value of G is r* and dG/dr = 0, the following equations (2) and (3):

$$r^* = -2\sigma_0/g_v \tag{2}$$

$$G^* = (16\pi\sigma_0^3/3g_v^3) \cdot f(\theta) \tag{3}$$

Therefore, if the radius of a cluster is larger than r*, G is decreased as the cluster grows, so that cluster growth continues. On the contrary, if the radius of a cluster is smaller than r*, average growth does not occur. This value of r* is called a critical radius, a cluster of r = r* is called a critical nucleus, and a cluster larger than a critical nucleus is called a stable nucleus. G* is considered to be an activation energy required to generate the stable nuclei. In addition, assuming that the number of adsorption sites per unit area is $n_0$, a number density $n^*$ of critical nuclei formed on a substrate is given by the Boltzmann equation as follows:

$$n^* = n_0 \exp(-G^*/kT) \qquad (4)$$

As is apparent from the equations (2), (3), and (4), the larger the surface energy $\sigma_0$ is, or the smaller the volume energy change $|g_v|$ during cluster generation is, the larger the critical radius $r^*$ becomes, and the smaller the number density $n^*$ of the critical nuclei becomes. The number density n of the critical nuclei is also affected by the contact angle $\theta$ in addition to the surface energy of the thin film material or the degree of supersaturation. When the surface free energy of the substrate material is small and that of the thin film material is large, $\theta$, i.e., $f(\theta)$ is increased, and the number density $n^*$ of the critical nuclei is decreased. Thus, the critical nuclei stochastically generated on the substrate continuously grow as stable nuclei, and then these nuclei coalesce with each other to form a thin film. Therefore, as for surface roughness of the thin film thus formed, when density of the stable nuclei initially generated on the substrate is low, the radius at which nuclei coalesce with each other is large, resulting in large surface roughness of the thin film.

As described above, when a thin film material with a large surface free energy is deposited on a substrate with a small surface free energy in a state wherein the degree of supersaturation is small, large nuclei are sparsely generated and surface roughness of the thin film is enlarged. The surface free energy is generally small in an insulator such as an oxide and is large in a metal (e.g., aluminum) or silicon. Therefore, when a thin metal film is formed on an insulating substrate, this tendency most significantly appears. In normal vacuum evaporation or sputtering, since the degree of supersaturation is as extremely large as to $10^{10}$ to $10^{20}$, the critical radius is as small as several Å or less, and the density of the critical nuclei is as high as substantially the number of adsorption sites. Surface roughness of the thin film deposited by these deposition methods is sufficiently small, thereby posing no problem. However, in CVD, it is said that the degree of supersaturation is not so large (reference: W. A. P. Claassen and J. Bloem: J. Electrochem. Soc.: Solid-St. Sci. & Tech. 127 (1980) 194.), and the number density of the critical nuclei is so decreased as to affect surface roughness of deposited film.

Practically, in CVD of a thin metal film, surface roughness poses a serious problem in many cases. For example, when refractory metal films such as molybdenum or tungsten film are deposited by vacuum evaporation or sputtering, a thin film having a small grain size of about several hundreds Å and a smooth surface can be obtained. On the contrary, when CVD is used, large projections are formed on the surface by stone wall-like grains with a diameter of 1,000 Å. The reason for this is assumed as follows. That is, in vacuum evaporation or sputtering, substrate temperatures during deposition are usually as low as 300 to 400° C. While, in CVD method, a substrate temperature higher than 500 to 600° C. which is a decomposition temperature of a source gas is required. This high substrate temperature promotes crystal growth during deposition and deposited films tend to have large grain size. In addition, the low number density of critical nuclei caused by small supersaturation in CVD is another main factor.

Surface roughness poses a serious problem especially in a thin aluminum film formed by CVD. That is, although the substrate temperature of 250 to 300° C. is not so much higher than that by vacuum evaporation, projections are formed by about 10% that a film thickness, so that this method is not put into practice. It is also assumed that a cause of surface roughness is based on a nucleus growth process. A reference for this is, e.g., "R. A. Revy, M. L. Green and P. K. Gallagher: J. Electrochem. Soc.: Solid-St. Sci. & Tech. 131 (1984) 2175". FIG. 11 shows a photograph of a typical metal texture of aluminum deposition by CVD. In FIG. 11, surface roughness caused by crystal grains is present, and gaps are partially formed between the grains.

When large roughness is formed on the thin film surface, it is difficult to form micropatterns with high accuracy by photolithography, and variations occur in the thin film characteristics such as an electrical resistance. In addition, when another thin film is deposited on this thin film to form a multilayer structure, partial variations occur in film thickness at projections, so that an ideal multilayer structure cannot be obtained. As a result, a serious problem is posed when it is used as a material of a semiconductor IC and the like. Micropatterning and high accuracy are required for a semiconductor IC along with its high speed operation and high packing density. In a submicron device or a nanometer device, such a reduction in thin film roughness is a most serious subject.

Problems of conventional CVD can be summarized as follows.

(1) It is very difficult to form a smooth thin film, especially a metal thin film with small surface roughness.

(2) It is difficult to selectively grow a thin film because a high substrate temperature is required during film deposition. In addition, degradation or malfunction of a semiconductor device caused by changes in physical and chemical states of a substrate and a deposited film during film deposition cannot be eliminated.

(3) It is difficult to deposit metal alloy films using two or more source gases whose reaction temperatures are different from each other. Further, it is impossible to deposit aluminum-silicon alloy films with smooth surface, because source gases of silicon such as silane are not decomposed at such low temperatures as surface topography of deposited aluminum film is smooth.

SUMMARY OF THE INVENTION

It is, therefore, a principal object of the present invention to provide an improved CVD method compared with a conventional method, for forming a thin film on a substrate and an apparatus therefor.

It is another object of the present invention to provide a CVD method capable of forming a smooth thin film with high quality on a substrate and an apparatus therefor.

It is still another object of the present invention to provide a CVD method capable of filling fine via holes to form a flat surface and an apparatus therefor.

According to an aspect of the present invention, there is provided a CVD method characterized in that a heating block and a surface to be deposited of a substrate are arranged to face to each other at a given distance in a closed space, a source gas is guided to the closed space and supplied between the heating block and the substrate, thereby depositing a thin film on the surface to be deposited of the substrate.

According to another aspect of the present invention, there is provided a CVD apparatus comprising a heating block arranged in a closed space, a substrate holder for holding a substrate so that a surface to be deposited of the substrate is arranged to face to the heating block at a given distance, and a device for quiding a source gas to the closed space, wherein the source gas guided by the device is guided to the closed space and supplied between the heating block and the substrate, thereby depositing a thin film on the surface to be deposited of the substrate.

BRIEF DESCRIPTION OF THE DRAWINGS

FIG. 5 is a graph of a relationship between a temperature of a heating block and that of a wafer substrate in the CVD apparatus of FIG. 1;

FIG. 7 is a graph of film thickness dependency of resistivity of an aluminum film deposited by the present invention;

FIG. 8 is a sectional view of a via hole obtained when aluminum is selectively grown on a barrier layer;

FIG. 16 is a graph showing the process of aluminum deposition in the method according to the present invention;

DESCRIPTION OF THE PREFERRED EMBODIMENTS

[Embodiment 1]

Figure 1:
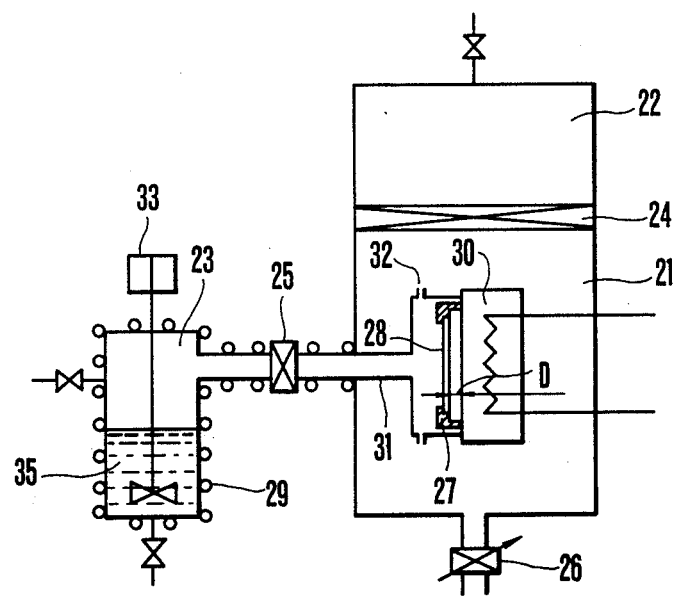
FIG. 1 is a schematic view of a CVD apparatus according to an embodiment of the present invention.

At first, a CVD apparatus used to carry out the present invention will be briefly described below. FIG. 1 shows an overall arrangement of a CVD apparatus, in which detailed parts, an exhaust system, and a control system are omitted.

A vacuum chamber of this apparatus mainly consists of three chambers, i.e., a deposition chamber 21, a load lock chamber 22, and a source chamber 23, all of which are independently evacuated. An ultimate pressure of each vacuum chamber is preferably a high vacuum of about $10^{-6}$ Torr. However, a low vacuum achieved by only a rotary pump substantially has no influence upon carrying out of the present invention. The deposition chamber 21 is connected to the source and load lock chambers 23 and 22 respectively through valves 25 and 24, and a heating block 30 capable of heating up to a maximum temperature of 500° C. is disposed therein. Reference numeral 26 denotes a variable conductance valve. A substrate holder 27 can fix a deposition wafer substrate 28 guided from the wafer load lock chamber 22 so that the wafer substrate 28 faces to the heating block 30 and is separated therefrom by a predetermined interval. At this time, a surface to be deposited of the wafer faces to the heating block 30 at a given interval. An arrangement is such that an interval D between the wafer substrate 28 and the heating block 30 can be varied in the range of about 2 to 15 mm. A heater 29 is wound around ar outer wall of the source chamber 23 to heat a liquid temperature of a source up to a predetermined temperature. An agitating motor 33 is disposed in the source chamber 23 to uniform the liquid temperature. A cylindrical pipe 31 horizontally projecting from an upper portion side wall of the source chamber 23 is guided into the deposition chamber 21 through the valve 25, and an enlarged end portion thereof is urged against the heating block 30. A fine orifice 32 is formed in a side surface of the enlarged cylindrical pipe 31 so that an internal pressure of the cylindrical pipe 31 can be maintained close to that of the source chamber 23 by differential evacuation even when a pressure of the deposition chamber 21 is reduced below 0.01 Torr. A path of a source gas from the source chamber 23 to the deposition chamber 21 can be heated up to the same temperature as that of the source chamber 23 so that a evaporated source is not liquidized again.

Figure 2:
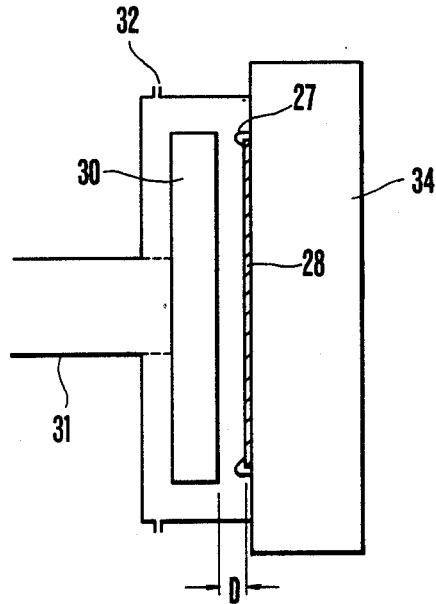
FIG. 2 is a schematic view of part of a CVD apparatus having a heater at a rear side of a substrate according to the embodiment of the present invention.

The wafer substrate 28 in the apparatus having the arrangement shown in FIG. 1 is heated by heat conduction of a source gas, a temperature of which is increased by the heating block 30. Therefore, no special tool is provided to heat the substrate. When temperatures of the gas and the substrate need be independently controlled, a substrate heater 34 is provided on a rear surface of the wafer substrate 28, as shown in FIG. 2. FIG. 2 shows a positional relationship between the wafer substrate 28, the heating block 30, and the heater 34, and portions except for those shown in FIG. 2 are identical to those shown in FIG. 1.

Figure 3:
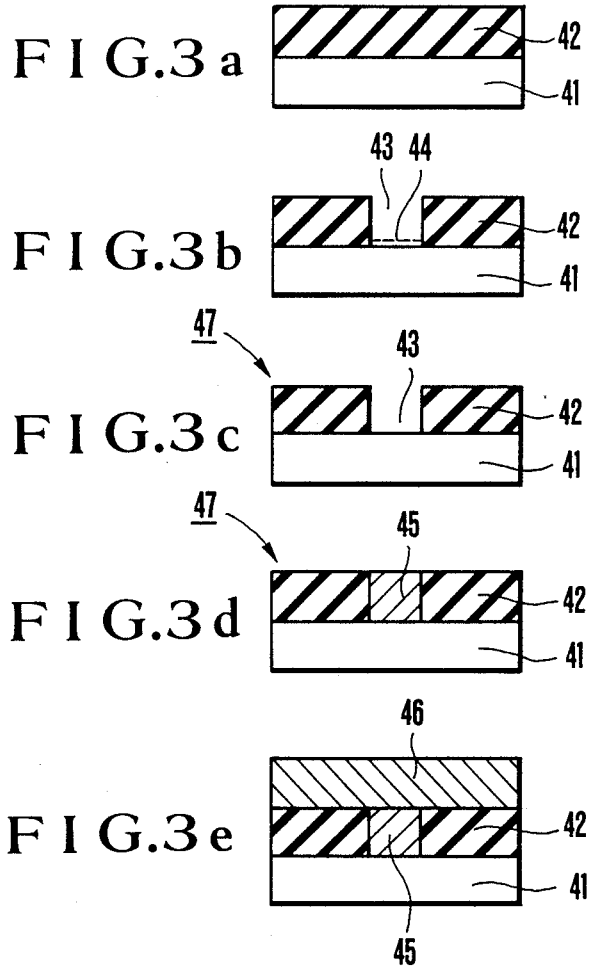
FIGS. 3a to 3e are sectional views of manufacturing steps showing the embodiment of the present invention.

An example wherein aluminum is selectively grown using such a CVD apparatus will be described below with reference to FIG. 3.

Prior to CVD, a silicon dioxide film 42 is formed on a silicon substrate 41, as shown in FIG. 3a. In this case, a (100) p-type 5-Ω·cm silicon substrate 41 is used, but one having another orientation or resistivity may be similarly used. In this embodiment, the silicon dioxide film 42 is formed by thermally oxidizing silicon. However, if it is· deposited by another formation method, e.g., a chemical vapor deposition or sputtering, substantially no difference occurs. In addition, another material such as a phosphorus- or boron-doped silicon dioxide film or a silicon nitride film may be used. That is, as long as it is a thin insulating film, substantially no change occurs in an effect of the present invention.

Then, as shown in FIG. 3b, a resist mask pattern is formed by known photolithography, and a via hole 43 is formed by etching. Several methods are known for photolithography and etching of the silicon dioxide film 42, and any method may be used. However, when so-called dry-etching using a gas plasma is performed to etch the silicon dioxide film 42, a polymer film or an alteration layer which is too small to be observed may be formed on an exposed silicon surface. Since such a small change in a surface largely adversely affects the following aluminum deposition step, a careful attention must be paid. In addition, when not dry etching but wet etching using buffer hydrofluoric acid is performed to obtain a clean silicon surface, a thin natural oxide film is formed or another contamination occurs on the silicon surface by a step of removing a resist pattern used as an etching mask or simply by a time lapse. A natural oxide film layer 44 shown in FIG. 3b includes such a natural oxide film or an altered/contaminated layer.

In order to remove the natural oxide film layer 44 as described above, a preparation step must be provided immediately before deposition of aluminum to clean the silicon surface, as shown in FIG. 3c. A main purpose of this step is to remove the natural oxide film layer 44 formed on the silicon surface so as to assure reproducibility of selective deposition of aluminum in the next step, and simultaneously obtain a continuous, smooth, and good aluminum film. A normal preparation step is performed such that a silicon substrate 47 is dipped into a 1.5% diluted hydrofluoric acid solution for 10 seconds to a few minutes, and after hydrophobic nature of a silicon opening portion is confirmed, the silicon substrate 47 is cleaned by distilled water for a few minutes to a value between 10 and 20 minutes and then is dried.

Since an etching rate of the natural oxide film 44 is increased as a concentration of hydrofluoric acid is increased, a time required for obtaining hydrophobic nature is reduced when the concentration is high. However, since the surface of the silicon dioxide film 42 is also etched by hydrofluoric acid, etching conditions must be selected case by case.

In addition, when a washing time is increased, an oxide film is formed on the silicon surface again to exhibits hydrophilic nature. Therefore, washing must be interrupted before that. Hydrophobic nature is not occasionally obtained even after the natural oxide film 44 is etched, or a smooth and continuous aluminum film is not sometimes obtained even after hydrophobic nature is obtained. These phenomena occur when the silicon surface is contaminated or damaged due to above-mentioned dry etching and the like. In this case, after the via hole 43 is formed, a several tens- to several hundreds-Å thick silicon oxide film is formed at the opening portion by, e.g., oxidizing the silicon surface at about 900° C. in an oxygen atmosphere. Then, this oxide film is removed using a diluted hydrofluoric acid solution and the like to obtain hydrophobic nature, thereby forming a good aluminum film.

Figure 13:
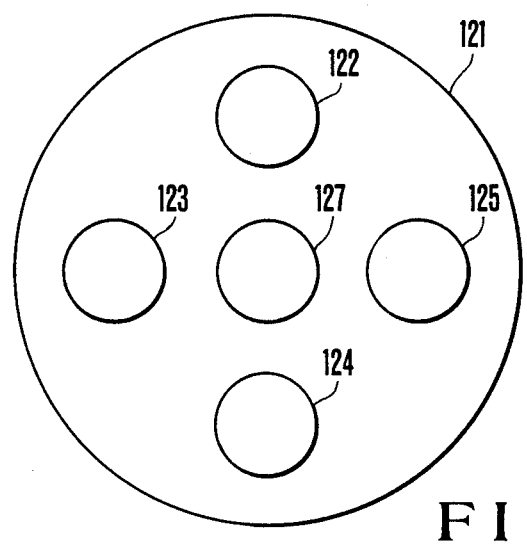
FIG. 13 is a plan view showing the CVD apparatus for mass production.
Figure 14:
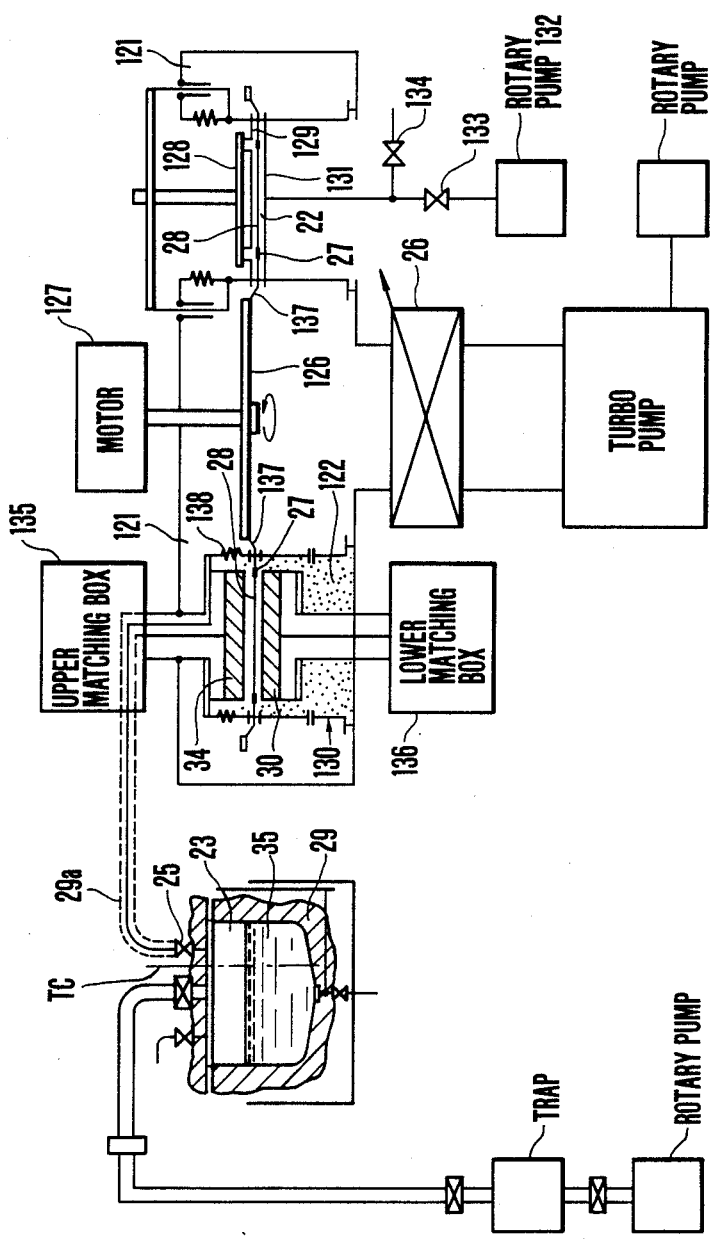
FIG. 14 is a detailed view showing the CVD apparatus of FIG. 13.

In order to remove the natural oxide film 44, after a wafer substrate 47 is disposed in a CVD apparatus for depositing aluminum, a substrate surface may be cleaned by dry etching or the like immediately before deposition. This method can be effectively adopted in addition to the above method. If the substrate surface is made of single-crystal silicon, almost no problem is posed. However, when aluminum is selectively deposited on a substrate made of polysilicon or aluminum, a natural oxide film layer is formed in a very short time period from removal of the natural oxide film layer 44 using diluted hydrofluoric acid and the like to deposition of aluminum, so that good aluminum cannot be deposited. In this case, as shown in FIGS. 13 to 15, a CVD apparatus comprising an RF plasma etching mechanism must be used. It is a matter of course that ECR (Electron Cyclotron Resonance) etching and the like may be used in addition to RF plasma etching. In this ECR method, a treatment was performed in a Freon gas atmosphere with an acceleration voltage of about 500 V for a few minutes, and good aluminum is deposited. If an underlying substrate consists of aluminum, a natural oxide film is formed when a standstill time in vacuum is increased after etching by RF plasma and the like, so that good aluminum cannot be deposited. The range of standstill time for depositing a good film was about 1 to 2 minutes when a substrate temperature was 250° C. and a pressure was $10^{-4}$ Torr. When the substrate was left to stand for 3 to 5 minutes, an aluminum film with large surface roughness was deposited, and when the substrate was left to stand for 10 minutes, no aluminum film was deposited and only nuclei of aluminum were formed. When the substrate was left to stand for 30 minutes, nothing was deposited. Therefore, it is found that removal of a natural oxide film layer shown in FIG. 3c is a very important step to deposit a good film and deposition must be started immediately after removal of the natural oxide film layer 44. In addition, the thickness of the natural oxide film formed in vacuum is determined by a partial pressure of oxygen or water in vacuum, the substrate temperature, and the standstill time. Therefore, if a time interval until deposition is started is increased, a pressure in the deposition chamber must be maintained as low as possible. Note that a term "wafer substrate" includes all of those shown in each FIG. 3a to 3e.

The wafer substrate 47 subjected to the above treatment is set in a reaction chamber to deposit aluminum. However, before the wafer substrate 47 is set, the CVD apparatus requires the following preparation. That is, the source, deposition, and load lock chambers 23, 21, and 22 are sufficiently evacuated, liquid 35 of triisobutyl aluminum is supplied into the source chamber 23 and then heated up to a predetermined temperature while uniforming a temperature by the agitating motor 33. Although triisobutyl aluminum has a sufficiently high vapor pressure even at room temperature without heating, it can be efficiently evaporated when heated. However, if a heating temperature exceeds 50° C., triisobutyl aluminum tends to be converted into diisobutyl aluminum halide having a low vapor pressure, so that a heating temperature cannot be set much higher. In this case, it was mainly set to be 45° C.

As for a capacity of supplying a source gas, the source chamber 23 has a cylindrical shape with a diameter of about 10 cm and a height of about 22 cm. With such a liquid temperature and a surface area, a sufficiently high evaporation rate of a source liquid can be obtained, so that the pressure in deposition chamber close to the vapor pressure of the source gas can be maintained during normal gas consumption of about several tens cc/min. In addition, since the source chamber 23 has a cylindrical shape, the surface area of the liquid does not change even if an amount of the source gas changes, so that the evaporation rate is always maintained constant. Therefore, a flow rate of the source gas can be changed by changing a conductance of an orifice 32 formed in a side surface of the cylindrical pipe while maintaining a pressure substantially constant. The heating block 30 in the deposition chamber 21 is also heated up so as to obtain a constant temperature.

After the above preparation, the wafer substrate 47 subjected to the preparation step shown in FIG. 3c (corresponding to reference numeral 28 in FIG. 1) is set in the load lock chamber 22, and the wafer load lock chamber 22 is sufficiently evacuated. Subsequently, the wafer substrate 47 (28) is moved to the deposition chamber 21, and a surface to be deposited of the wafer substrate 47 (28) is held to face to the heating block 30 for a few minutes, thereby maintain a temperature of the wafer substrate 47 (28) substantially constant. At this time, by flowing an inert gas such as argon gas around the wafer, the wafer substrate 47 (28) can be heated more effectively.

Subsequently, the valve 25 between the source chamber 23 and the deposition chamber 21 is opened to supply the source gas into the deposition chamber 21, thereby starting deposition of aluminum. That is, the gas supplied into the deposition chamber 21 is diffused between the wafer substrate 47 (28) and the heating block 30 to start deposition. Note that the interior of the source chamber 23 is preferably evacuated at a flow rate similar to that during deposition for a proper time until the valve 25 is opened so that a pressure of the deposition chamber 21 is not largely changed immediately until the valve 25 is opened. After a predetermined deposition time has passed, the valve 25 between the source and deposition chambers 23 and 21 is closed to complete deposition. By performing the above operation, aluminum 45 can be selectively deposited on only the opening portion 43 of the silicon substrate as shown in FIG. 3d.

In order to selectively deposit aluminum 45 with good smoothness on silicon at only the opening portion 43, but not on the silicon dioxide film 42, film deposition conditions must be carefully chosen. Especially, an interval D between the wafer substrate 47 (28) and the heating block 30 and a temperature of the heating block 30 are important parameters.

A gas flow rate was about 20 to 30 cc/min, a pressure of a source gas in the cylindrical pipe 31 was 0.5 Torr, a pressure of the deposition chamber 21 was about 0.05 Torr, and the interval between the wafer substrate 47 (28) and the heating block 30 was 5 mm. Under these conditions aluminum was deposited on silicon at a heating block temperature of about 300° C. or more. When a temperature exceeded 340° C., a film thickness distribution occurred such that an aluminum film deposited on silicon at a peripheral portion of the wafer was thicker than that of a central portion thereof. When the temperature is further increased, island-like aluminum nuclei are also formed on the silicon dioxide film 42, i.e., aluminum is nonselectively deposited on silicon and the silicon dioxide film.

Figure 4:
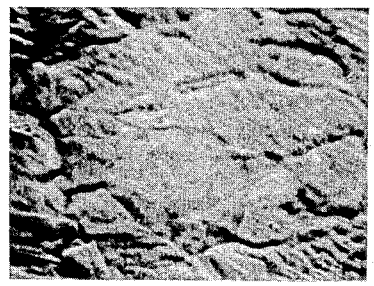
FIG. 4 is a photograph of a metal texture of aluminum deposited on a silicon substrate using a CVD method according to the present invention.

When the heating block temperature was in a range of about 300 to 330° C., it was found that the surface of aluminum having a film thickness above about 500 Å exhibited a flat crystal grain and smooth and good film quality could be obtained. FIG. 4 is a photograph of a metal texture of aluminum obtained when the temperature of the heating block 30 is 310° C. Aluminum shown in FIG. 11 which was formed by conventional CVD had a group of small crystal grains and had large surface roughness, and gaps were partially formed between grains. On the contrary, according to the present invention, a smooth surface with a large grain size of about 5 to 10 μm can be obtained, and no gap is formed between grains, as shown in FIG. 4.

When D=8 mm, deposition was started over 330° C., and uniformity in deposited film thickness was degraded over 360° C. Good film quality as shown in FIG. 4 was obtained at a temperature of about 330 to 350° C. When D<2 mm or D>15 mm, it was difficult to obtain an aluminum film with good quality, and a film with rough surface similar to the conventional one was obtained. The above temperature range and the value of D varied in accordance with a gas flow rate, and when the flow rate was large, the temperature of the heating block 30 had to be increased.

Figure 11:
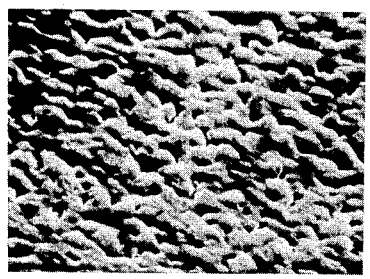
FIG. 11 is a photograph of a metal texture of aluminum deposited on a silicon substrate by a conventional CVD method.

Although several reports have been made in relation to deposition of aluminum by CVD (but not selective growth, surfaces of deposited films in all these reports are similar to that shown in FIG. 11, i.e., a large and smooth crystal structure as in this embodiment has not been obtained. One of reasons for such good film quality can be assumed that a gas is heated at a temperature higher than that of the substrate immediately before deposition.

Methods of heating a deposition substrate in a conventional CVD method are classified into two types. One of them is a hot wall type in which an entire quartz pipe being installed deposition substrates therein is heated by a heater. In this case, a source gas is heated up to the same temperature as that of the quartz pipe while flowing therethrough. Therefore, according to this hot wall type, a gas temperature substantially equals a substrate temperature. On the other hand, according to a cold wall type, only a substrate holder is heated, and a deposition substrate is fixed on the substrate holder in tight contact therewith and is heated. Therefore, in this cold wall type, a gas having a lower temperature than that of the substrate is supplied to the heated substrate.

Unlike the conventional CVD methods as described above, according to the present invention, a source gas is heated by the heating block 30, and then the deposition substrate 28 is heated by the source gas. Therefore, it is a first feature of the present invention that a temperature of the source gas is higher than that of the substrate. In addition, it is a second feature of the present invention that a gas flowing with respect to a substrate does not act thereon but a gas supplied into a closed space is diffused toward the substrate and is deposited thereon.

As a result of measuring a temperature of the wafer substrate during deposition using a thermocouple, it was found that the substrate temperature was increased at the same time the source gas was flowed to start deposition and became substantially constant within 1 to 2 minutes thereafter. When an inert gas such as argon is flowed before the source gas is flowed, a steady temperature is obtained earlier.

FIG. 5 shows a measurement result of a wafer substrate temperature obtained 10 minutes after deposition is started. A deposition condition was a standard one such that a pressure of a source gas in the cylindrical pipe 31 was 0.5 Torr and a pressure of the deposition chamber 21 was about 0.05 Torr. As shown in FIG. 5, almost no difference is found when a distance D between the wafer substrate 28 and the heating block 30 is 5 and 8 mm, and a linear relationship is present between a temperature of the wafer substrate 28 and that of the heating block 30 within a measured temperature range. A temperature difference between them is about 70° C. Thus, almost no difference is present between the substrate temperatures even when D varies. This can be assumed that the wafer 28 is surrounded by the cylindrical pipe 31 for transporting a source gas and the heating block 30, i.e., placed in a closed atmosphere. When the cylindrical pipe 31 is separated from the heating block 30, aluminum can also be deposited with good film quality. However, in this case, the temperature range of the heating block 30 is changed. Note that if a volume of the deposition chamber 21 itself is decreased and the flow rate is controlled using the variable conductance valve 26, an atmosphere similar to the closed one can be obtained, thereby realizing substantially the same condition as described above.

In this embodiment, deposition sufficiently progresses when D=5 mm and the temperature of the heating block is 310° C., and at that time, the temperature of the wafer substrate is about 240° C. as shown in FIG. 5. However, when a conventional cold wall type CVD method without the heating block 30 is used, deposition rarely progresses at the substrate temperature of 240° C. even if the other conditions are kept unchanged. In order to obtain a deposition rate to the same extent as that of this embodiment by conventional CVD, the substrate must be heated up to about 270° C. Therefore, according to the present invention, the substrate temperature can be decreased by about 30° C.

The source gas is heated up to a high temperature by the heating block 30 and activated. Then, the source gas in a decomposition state reaches the substrate 28. It is difficult to know how the source gas on the substrate is decomposed into aluminum, but it can be assumed that in this state, aluminum is relatively highly supersaturated as compared to that in the conventional CVD method. In this case, according to a nucleus growth theory, a change in volume energy during generation of clusters is increased, and an activation energy $G^*$ of stable nuclear generation is decreased and a number density $n^*$ of critical nuclei is increased, as is apparent from the equations (3) and (4). Therefore, an average nucleus radius when they coalesce with each other is decreased, so that a smooth film with less surface roughness can be formed.

Unlike the other conventional CVD methods, the present invention has the following important characteristic in addition to that described above. That is, according to the hot wall type, since the entire deposition atmosphere is heated up to the same temperature as that of the substrate, reaction occurs on the entire wall surfaces of the deposition chamber, so that the source gas is wasted. In addition, materials adhered to the wall surfaces must be periodically removed, resulting in cumbersome maintenance of the apparatus. However, according to the present invention, the source gas in a low-temperature state is supplied to the deposition chamber 21, and is heated up to a high temperature when it reaches the substrate 28. In this case, the gas is consumed only on the deposition substrate 28 and on the surface of the heating block 30. Since areas of these heating portions are much smaller than those of the hot wall type, the present invention is superior in prevention of consumption of the source gas and in maintenance of the apparatus.

Another characteristic of the present invention is that a source gas which is hardly decomposed by conventional CVD can be deposited since the gas temperature can be increased much higher than the substrate temperature. That is, by heating the source gas up to a high temperature in the heating block 30, the gas is activated or converted into a material liable to react. Therefore, decomposition on the substrate 28 at a low temperature can be effectively promoted, so that a thin film can be deposited at a low substrate temperature.

Triisobutyl aluminum used as the source gas in this embodiment is decomposed into diisobutyl aluminum halide with a low vapor pressure at a temperature of 50° C. or more. For this reason, the source gas is condensed and liquidized when it is heated up to 100 to 200° C. in a gas transport path, so that the source gas cannot be sufficiently supplied to the deposition substrate 28. In this embodiment, the source gas is supplied at a low temperature of about 50° C. immediately before the deposition substrate 28, and is heated up to a high deposition temperature near the surface of the heating block 30 which is heated up to a high temperature. Therefore, liquefaction of the source gas in the transport path can be prevented.

In addition, the front surface of the deposition substrate 28 faces close to the heating block 30. Therefore, the source gas heated up to a high temperature is supplied onto the front surface of the deposition substrate 28 facing to the heating block 30 while the source gas at a relatively low temperature contacts the rear surface thereof. Actually, aluminum is not deposited on the rear surface of the deposition substrate 28 under the standard deposition conditions. Since almost no difference is present between temperatures of the front and rear surfaces of a wafer itself, reaction is promoted by heating the gas in this deposition method. Therefore, it can be understood that heating of the gas is very important.

Furthermore, triisobutyl aluminum supplied near the heating block 30 is converted into diisobutyl aluminum halide with a low vapor pressure, and the wafer substrate 28 at a low temperature is disposed near the heating block 30. Therefore, the wafer surface is in an extremely supersaturated state, and in this embodiment, this is one of important factors of formation of a good aluminum film with smoothness.

According to the present invention, the source gas itself was heated up to a predetermined temperature by the heating block 30, and the deposition substrate 28 was heated by the gas. Therefore, as compared to the conventional cold wall type CVD method, reproducibility and uniformity of a deposited film was significantly improved.

In this embodiment, deposition on the wafer substrate 28 progresses by the excessive gas which is not consumed in the heating block 30. Therefore, an amount of aluminum deposited on the deposition substrate 28 is influenced whether the surface of the heating block 30 is made of silicon or aluminum on which aluminum tends to be deposited or of a silicon dioxide film on which aluminum is hardly deposited. For example, when the surface of the heating block 30 is constituted by patterns of silicon and silicon dioxide films and the deposition substrate 28 is a silicon wafer, aluminum is not deposited on the entire surface of the silicon wafer 28 but only on a portion facing to the silicon oxide film pattern on the surface of the heating block 30.

Therefore, in order to improve consumption efficiency of the source gas, the surface of the heating block 30 is preferably made of a material of a low surface free energy, on which aluminum is hardly deposited, such as silicon dioxide, titanium dioxide, tantalum pentoxide, molybdenum oxide, and vanadium pentoxide. However, even if such a material is used, once aluminum is deposited, deposition of aluminum progresses thereafter, so that gas consumption cannot be reduced. In this embodiment, although aluminum is used as a material for the surface of the heating block 30, no problem is posed in gas consumption efficiency in normal deposition.

Deposition of aluminum varies in accordance with deposition conditions such as a flow rate and a pressure of a source gas in addition to a temperature of the heating block and that of the substrate.

As described above, a pressure of a gas can be controlled by changing the temperature of the source chamber 23 in a range of room temperature to about 50° C. In this embodiment, selective growth could be performed in the control range of the pressure of about 0.2 to 2 Torr in the above temperature range of the chamber 23. When the pressure was 0.2 Torr or less, almost no deposition progressed, and a deposition rate was increased as the pressure was increased.

A flow rate of the source gas largely depends on the apparatus since a flow speed of the gas on the wafer surface is largely affected by a structure of the deposition chamber 21 even if the flow rate is constant. Therefore, it is difficult to control the flow rate in a conventional manner. In this embodiment, a standard flow rate was about 20 to 30 cc/min or less, and film deposition was not largely affected. However, when the flow rate was increased, a temperature of the gas on the wafer surface was decreased, and aluminum was hardly deposited thereon. For example, when the flow rate was increased, deposition did not occur unless the substrate temperature was increased higher than that used when the flow rate was a standard one by 20 to 30° C. Such a phenomenon did not occur when the gas flow rate was small, and in an extreme case, aluminum with a sufficient film thickness could be deposited even when exhaust was stopped and the deposition chamber 21 connected to the source chamber 23 was closed. Note that in this case, a pressure in the deposition chamber 21 increases as time passes due to the generation of isobutylene and hydrogen gases decomposed from triisobutyl aluminum.

Figure 6:
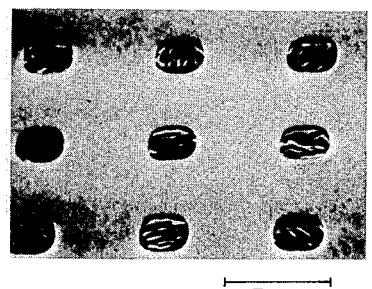
FIG. 6 is a photograph of a metal texture of aluminum selectively deposited in fine via holes.

FIG. 6 shows a photograph of a metal texture of aluminum deposited in the fine opening portion 43 under the typical deposition conditions such that the interval D between the heating block 30 and the deposition substrate 28 is 5 mm, the temperature of the heating block 30 is 310° C, and a pressure is 0.5 Torr. As is apparent from FIG. 6, a smooth aluminum surface can be obtained. In addition, aluminum is selectively deposited in only the silicon opening portion but is not grown on the silicon dioxide film at all. In this case, the thickness of the silicon dioxide film is 5,000 Å, and aluminum with substantially the same thickness is deposited on silicon. FIG. 7 is a graph showing film thickness dependency of resistivity of deposited aluminum. When the film thickness is 1,000 Å or more, resistivity of 2.9 $\mu\Omega$·cm near the bulk can be obtained, and even if the film is thin as 500 Å, the film exhibits conductivity. Therefore, it is found that this is a continuous aluminum film.

FIG. 3e shows a state wherein aluminum 45 having the same thickness as that of the silicon dioxide film 42 is selectively deposited in the silicon opening portion 43 and then an aluminum film 46 is deposited on the entire surface by conventional sputtering. FIG. 3e also shows a sectional shape of the silicon opening portion obtained when an aluminum wiring pattern is formed by pattern formation.

In this embodiment, the via hole 43 on the substrate silicon 41 formed in the silicon dioxide film 42 is filled with aluminum. Materials other than a combination of the silicon dioxide film 42 and the silicon substrate 41 may be used to obtain the same result. An aluminum wiring of a semiconductor IC is often connected to an element portion or a wiring underlying layer through an opening portion of the insulating film. In this case, an underlying material in the opening portion is normally monocrystalline or polycrystalline silicon containing various impurities, or aluminum. In addition, the following materials may be used; a metal such as titanium, molybdenum, tungsten, or platinum, a silicide material such as titanium silicide, tungsten silicide, molybdenum silicide, tantalum silicide, or platinum silicide, and a compound such as titanium nitride or molybdenum nitride.

Especially when an underlying layer is silicon, an interface tends to be degraded due to reaction with aluminum. Therefore, as shown in FIG. 8, a barrier layer 53 of: titanium, titanium nitride, or titanium silicide; molybdenum or tungsten; a silicide thereof; or platinum silicide, may b formed on silicon 51, and then aluminum 54 may be selectively grown. Note that reference numeral 52 denotes a silicon dioxide film.

Since all of the above materials are metals or semiconductors having conductivity, aluminum can be selectively grown thereon. Especially, as for silicon, it is experimentally confirmed that aluminum can be deposited on silicon containing arsenic, phosphorus, or boron as an impurity up to the degree of solid solubility and on highly resistive monocrystalline or polycrystalline silicon with a low impurity concentration.

When an underlying layer is aluminum or an aluminum alloy such as aluminum containing silicon, it is a matter of course that aluminum can be deposited thereon because they are the same materials. However, a thin alumina layer having a thickness of several tens Å or more is sometimes formed on the surface. In this case, after an aluminum layer is etched using diluted hydrofluoric acid, the surface thereof need be cleaned in a vacuum chamber by plasma etching and the like immediately before deposition. Since the aluminum surface is rapidly oxidized even in vacuum, deposition of aluminum had to be started in a vacuum of, e.g., $10^{-4}$ Torr within one or two minutes after cleaning.

A silicon dioxide film is most widely used as a material of an insulating film in a semiconductor IC, but a silicon nitride film and the like is also used. Examples of a silicon dioxide film are a film formed by thermally oxidizing silicon, a film deposited by, e.g., a chemical vapor deposition or sputtering, and a phosphorus- or boron-doped film. Under the selective growth conditions of aluminum according to the present invention, aluminum is not deposited on these insulating films. As described above, formation of a flat aluminum wiring without a step at an opening portion as shown in FIG. 3e can be applied to every via hole in a semiconductor IC. When aluminum deposition is performed by only sputtering or vacuum evaporation without using selective growth, a step is formed on the surface of an aluminum film in the silicon opening portion on a via hole, and micro cracks are formed at a lower portion of the step, resulting in degradation of yield or reliability caused by disconnection. According to this embodiment, since aluminum having substantially the same thickness as that of the step of the via hole is selectively deposited, an aluminum wiring superior in yield and reliability in which a via hole portion of a semiconductor IC is flat and has no disconnection can be formed.

As described above, according to CVD using the heating block 30, an aluminum film having a smooth surface and a large grain size can be deposited with good reproducibility, uniformity, and selectivity. For this reason, a via hole can be filled to realize a smooth multilayer wiring.

In the above embodiment, only triisobutyl aluminum is used as a source gas. Another organic aluminum compound such as trimetyl aluminum or trietyl aluminum may be used as a source gas since it has identical chemical properties. In this case, aluminum can be deposited on a substrate by changing the deposition conditions.

[Embodiment 2]

In the second embodiment, triisobutyl aluminum and disilane are used as source gases, and a silicon-containing aluminum alloy is deposited.

In the first embodiment, pure aluminum is deposited. However, as a wiring material, aluminum containing 1 to 2% of silicon is most widely used. The main reason for this is to prevent p-n junction leakage caused by reaction between a silicon substrate and aluminum.

When selective growth of aluminum is applied to a wiring, thin aluminum having a thickness of about 1,000 Å is used for enclosure of silicon patterns. When aluminum is used to fill a via hole, it is mainly used to connect aluminum wirings of upper and lower layers. In these cases, no serious problem such as reaction as described above occurs even if silicon is not contained in aluminum. Reaction can also be prevented by sandwiching a barrier layer of, e.g., titanium therebetween. However, if silicon is added in an aluminum film simultaneously with selective growth of aluminum, the range of applications can be further widened.

An aluminum CVD method in which a silane gas and an organic aluminum gas are simultaneously supplied onto a substrate to deposit aluminum containing silicon has been applied for patent (Japanese Patent Laid-Open No. 55-91119). However, it is actually impossible to realize such an effect in conventional thermal CVD and to use this method in the process of manufacturing a semiconductor IC. A substrate temperature used when aluminum is deposited using organic aluminum is maximally 400 to 500° C. or less. If the temperature is higher than that, it is difficult to obtain a good aluminum film, and even if such a film is obtained, an aluminum film, silicon as an underlying substrate, and a silicon dioxide film react with each other or are subjected diffusion, so that a desired structure cannot be obtained. When another semiconductor such as GaAs is used as an underlying layer, the result remains the same. On the other hand, since a decomposition temperature of silane is minimally 600° C. or more, silane is not decomposed in a temperature range capable of depositing aluminum. Therefore, it is impossible to dope silicon simultaneously with deposition of aluminum. If CVD in which a source gas is decomposed by energy other than heat, e.g., plasma CVD or optical CVD is used, aluminum can be deposited while silicon is simultaneously doped in the form of silane. However, such CVD has drawbacks as described above, resulting in degradation in the CVD features.

According to the present invention, organic aluminum such as triisobutyl aluminum, and a silane gas are used as source gases, and an aluminum film containing silicon can be effectively deposited. For example, when an apparatus shown in FIG. 2 is used, a temperature of the heating block 30 is set to be about 600° C., and a substrate temperature is set to be about 250° C., an aluminum film can be deposited simultaneously with decomposition of silane without reaction with a substrate. However, since the decomposition temperature of silane largely differs from the deposition temperature of aluminum, it is difficult to obtain deposition conditions with good uniformity. Therefore, disilane instead of silane is used to eliminate the above problem, so that an aluminum film containing silicon can be easily deposited.

In the apparatus shown in FIG. 2, the interval D between the heating block 30 and the wafer substrate 28 was 8 mm, and a temperature of the heating block 30 was 350° C. Disilane was flowed at a flow rate of 30 cc/min, and the other conditions such as a flow rate of triisobutyl aluminum were similarly set as those of the first embodiment. Note that a pressure of the gas in the deposition chamber 21 was as high as 0.8 Torr since this pressure was a sum of partial pressures of two gases. Under these conditions, concentration of silicon contained in aluminum was about 2%. As a result of an experiment, when only disilane was supplied and triisobutyl aluminum was not flowed at all, a temperature of the heating block 30 had to be increased up to 400° C. or more to decompose disilane so as to deposit silicon on the substrate. However, when disilane and triisobutyl aluminum were simultaneously supplied, silicon was doped in the aluminum film at a lower temperature, and it was found that silicon of percent order was contained therein at 350° C. or more. When the temperature of the heating block 30 is increased, decomposition of disilane is promoted, and a concentration of silicon in aluminum is significantly increased. Therefore, a concentration of silicon can be arbitrarily changed by controlling the temperature of the heating block 30 or the flow rate of disilane.

As described above, when triisobutyl aluminum and disilane are used as source gases in CVD using a heating block, aluminum containing an arbitrary amount of silicon can be deposited.

In the second embodiment, aluminum containing silicon is selectively grown, but aluminum can be deposited on an entire surface regardless of materials of an underlying substrate. Several methods of such nonselective growth are available. For example, when the temperature of the heating block is increased as high as 380° C. and the flow rate of disilane is decreased, aluminum containing silicon can be deposited on the entire surface. Note that according to this method, it is difficult to obtain uniformity of a film thickness. According to another method, only disilane is flowed when the heating block is at a high temperature of 400° C., thereby depositing thin silicon on the entire surface. Then, aluminum is deposited under the standard selective growth conditions as those in the first or second embodiment described above. In selective growth, aluminum is deposited only on silicon. However, according to this method, aluminum is deposited on the entire surface since the entire surface is covered with silicon. In this case, a film with good uniformity and quality can be obtained. In addition, since silicon deposited under aluminum is diffused into the aluminum film during deposition of aluminum or a heat treatment thereafter, silicon need not be doped when aluminum is deposited. Similarly, aluminum may be deposited after a thin film of, e.g., titanium is deposited.

[Embodiment 3]

FIGS. 9a to 9j show a third embodiment in which the present invention is used to selectively deposit aluminum on a gate electrode, a source, and a drain of a MOSLSI so as to obtain a low resistance. In FIGS. 9a to 9j, only a main flow of manufacturing steps is shown, and parts not directly associated with the present invention are omitted.

Figure 9A:
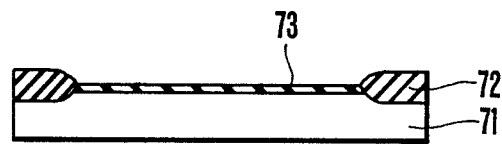
FIGS. 9a to 9j are sectional views of manufacturing steps showing another embodiment of the present invention.

At first, as shown in FIG. 9a, a p-type silicon substrate 71 having an isolation region 72 formed by a silicon dioxide film is prepared, and a gate oxide film 73 is formed in a region to serve as an active element.

Figure 9B:
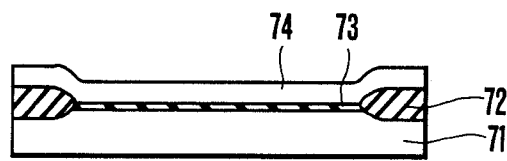
Figure 9C:
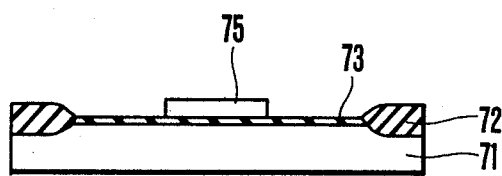

Then, as shown in FIGS. 9b and 9c, a polysilicon thin film 74 doped with phosphorus is deposited and then fabricated by photolithography and etching to form a gate electrode 75. An impurity of polysilicon may be arsenic or boron in addition to phosphorus.

Figure 9D:
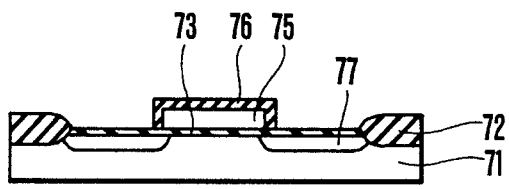
Figure 9E:
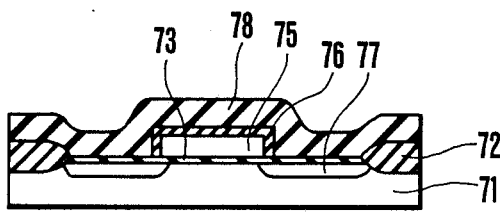

Subsequently, as shown in FIG. 9d, a periphery of the gate electrode 75 is oxidized to form a polysilicon oxide film 76, and ion-implantation is performed using the gate electrode 75 as a mask to form a source/drain 77. As an ion seed, arsenic or phosphorus is normally used in the case of an n-channel element, and boron is used in the case of a p-channel element. Thereafter, a heat treatment is performed to activate the implanted ions, and a silicon dioxide film 78 is deposited by a low-pressure CVD method.

Figure 9F:
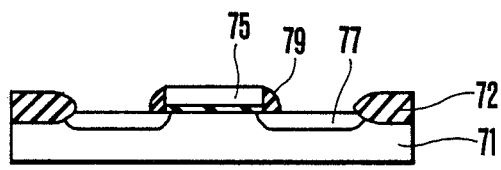

Since the silicon oxide film 78 is formed thick at side surfaces of the gate electrode 75, side walls 79 can be formed on the side surfaces of the gate electrode 75 by isotropic dry etching, as shown in FIG. 9f. The silicon dioxide film 78 may be any film as long as it is an insulating film formed thick on the side surfaces of the gate electrode 75, e.g., reflowed PSG (phosphosilicate glass) or BPSG (borophosphosilicate glass), a so-called bias sputtering silicon dioxide film which is slightly applied with bias and sputtered, or a silicon nitride film.

Figure 9G:
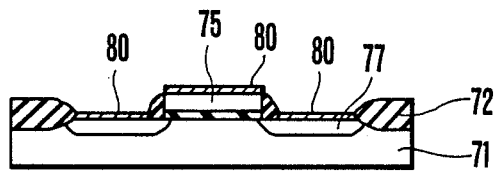

Thereafter, as shown in FIG. 9g, aluminum 80 is selectively deposited on the gate electrode 75 and the source/drain 77. Prior to deposition of aluminum, a pretreatment step is performed to remove a natural oxide film layer. Since dry etching is already performed, this pretreatment step is preferably performed such that a silicon dioxide film having a thickness of about 100 Å is formed at 800 to 900° C. and then etched by diluted hydrofluoric acid, thereby exposing a clean silicon surface. Deposition of aluminum was performed using the apparatus shown in FIG. 1 under the standard conditions such that D=5 mm, a temperature of the heating block was 310° C., and a pressure of the source gas was 0.5 Torr, and aluminum having a film thickness of about 1,000 Å was formed in a deposition time within about 10 minutes.

Figure 9H:
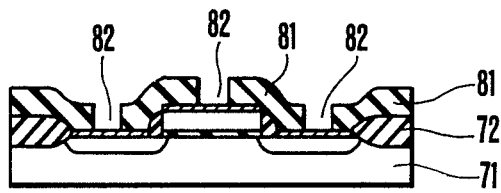
Figure 9I:
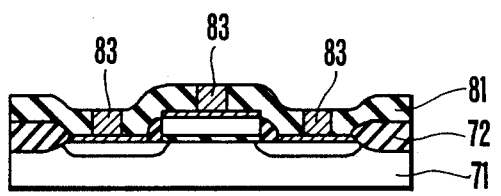

Then, as shown in FIG. 9h, an insulating interlayer 81 is deposited, and via holes 82 is formed using known photolithography and etching techniques. Thereafter, if we use a conventional method, an aluminum film is deposited using sputtering and the like to form a wiring. However, in this embodiment, the via holes are filled with a selectively-grown aluminum film 83 according to the present invention, as shown in FIG. 9i. Etching using diluted hydrofluoric acid is performed as a pretreatment step prior to deposition of aluminum, and aluminum is deposited in the same manner as in FIG. 9g. Note that alumina is removed by plasma cleaning in vacuum immediately before deposition. A film is deposited to have a film thickness of 5,000 Å which is the same value as that of a depth of the via hole, so that an interior of the via hole is reliably filled to obtain a flat surface.

Figure 9J:
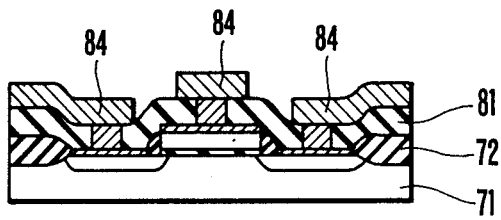

Thereafter, an aluminum film is deposited on an entire surface by sputtering and the like, and an aluminum wiring 84 as shown in FIG. 9j is completed by known photolithography and etching.

Note that in this case, aluminum may be deposited on the entire surface not using sputtering but using CVD according to the present invention. For example, after the via hole 82 is filled with selectively deposited aluminum, aluminum may be subsequently deposited on the entire surface under the nonselective growth conditions. A nonselective growth method may be performed by increasing the temperature of the heating block 30 or by depositing silicon and the like on the entire surface and then depositing aluminum.

As described above, in the third embodiment, polysilicon patterns and the source/drain is enclosed with selectively-grown aluminum to cause wirings to have a low resistance, and selectively-grown aluminum is also used to bury the via hole to realize a flat surface. Thus, selectively-grown aluminum is used for different two purposes.

Especially when this embodiment is applied to a enclosing technique, since a resistivity of aluminum is 2.9 $\mu\Omega$·cm, i.e., near the bulk value, a resistance can be decreased by 1/10 to 1/100 as compared with the case wherein tungsten or silicide is enclosed.

In addition, in the case of enclosure of the source/drain, if a film thickness of aluminum is large, aluminum reacts with substrate silicon to pose a problem of junction leakage and the like. However, when a thickness of aluminum is 1,000 Å or less as in this embodiment, almost no problem is posed.

Furthermore, if necessary, aluminum may be selectively grown after a barrier layer is formed on the source/drain or on the polysilicon gate electrode. A thickness of this barrier layer may be on the order of 100 to 1,000 Å. Since a resistance of the barrier layer having such a thickness is higher than that of selectively-grown aluminum by several to ten times, a low enough resistance cannot be obtained without aluminum enclosure.

[Embodiment 4]

FIGS. 10a to 10e show a fourth embodiment in which the present invention is applied to formation of an electrode of a bipolar LSI and formation of a resistive body using polysilicon.

Figure 10A:
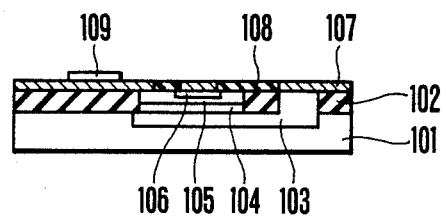
FIGS. 10a to 10e are sectional views of manufacturing steps showing still another embodiment of the present invention.

FIG. 10a shows a state wherein an npn transistor is formed in a silicon substrate 101, and a polysilicon electrode pattern is formed thereon That is, reference numeral 102 denotes an isolation oxide film; 103, an n+type buried layer; 104, a collector; 105, a base; and 106, an emitter In this state, the surface of the silicon substrate is constituted by a polysilicon electrode pattern 107, a silicon dioxide film 108 to isolate the polysilicon electrode pattern 107, and a resistive body formation mask 109 formed on a polysilicon region to serve as a resistive body. An insulator such as a silicon dioxide film or a silicon nitride film is used as a material of the mask 109.

Figure 10B:
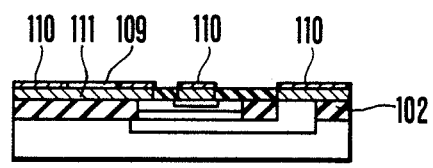

As shown in FIG. 10b, aluminum 110 is selectively grown on exposed polysilicon. A pretreatment step is performed to remove a natural oxide film layer prior to deposition of aluminum In this case, since dry etching is already performed, this preceding step may be preferably performed such that a silicon dioxide film having a thickness of about 100 Å is formed at about 800 to 900° C. and then etched by diluted hydrofluoric acid to expose a clean silicon surface. Aluminum was deposited using the apparatus shown in FIG. 1 under the standard conditions such that D=5 mm, a temperature of the heating block was 310° C., and a pressure of the source gas was 0.5 Torr, and aluminum having a thickness of about 1,000 Å was formed in a deposition time within about 10 minutes. By this aluminum 110, a low resistance of the polysilicon electrode pattern is obtained, and polysilicon below the resistive body formation mask 109 becomes a polysilicon resistive body 111 with a size predetermined in a self-alignment manner.

Figure 10C:
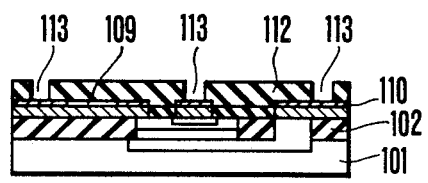
Figure 10D:
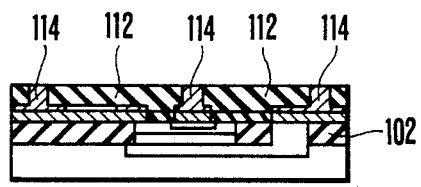

Then, as shown in FIG. 10c, an interlayer insulating film 112 is deposited, and a via hole 113 is formed by known photolithography and etching. Thereafter, in a conventional method, an aluminum film is deposited by sputtering and the like to form a wiring. However, in this embodiment, a second selectively-grown aluminum film 114 according to the present invention is used to fill the via hole, as shown in FIG. 10d. Etching using diluted hydrofluoric acid is performed as a preceding step prior to deposition of aluminum, and aluminum is deposited in the same manner as in FIG. 10b. Note that alumina is removed by plasma cleaning in vacuum immediately before deposition. Since a film is deposited to have a thickness, a value of which is the same as that of a depth of the via hole, an interior of the via hole is reliably filled to obtain a flat surface.

Figure 10E:
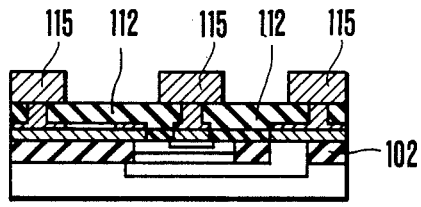

Thereafter, an aluminum film is deposited on the entire surface by sputtering and the like, and an aluminum wiring 115 as shown in FIG. 10e is completed using known photolithography and etching.

As described above, in the fourth embodiment, the polysilicon electrode is enclosed with selectively deposited aluminum, and at the same time, aluminum is used to form the resistive body. In addition, selectively deposited aluminum is used to fill the via hole, thereby realizing a flat surface.

Especially when this embodiment is applied to an enclosing technique, since a resistivity of aluminum is 2.9 $\mu\Omega$-cm, i.e., near the bulk value, a resistance can be decreased by 1/10 to 1/100 as compared with the case wherein tungsten or silicide is used as an enclosure. If a film thickness of aluminum is large, aluminum reacts with polysilicon to degrade element characteristics. However, when the film thickness of aluminum is about 1,000 Å as in this embodiment, almost no problem is posed.

If necessary, aluminum may be selectively grown after a barrier layer is bonded to the polysilicon electrode, as shown in FIG. 8. The thickness of the barrier layer may be on the order of 100 to 1,000 Å. Since a resistance of the barrier layer having such a thickness is higher than that of selectively deposited aluminum by 10 times or more, a sufficiently low resistance cannot be obtained without aluminum enclosure.

[Embodiment 5]

In the embodiments described above, the present invention is applied to deposition of aluminum. However, the present invention can be effectively applied to chemical vapor deposition of a metal other than aluminum or a semiconductor.

For example, when the present invention is applied to deposition and, more particularly, to selective growth of tungsten or molybdenum, a smooth and good film can be obtained. In the case of tungsten, tungsten hexafluoride is used as a source gas, and hydrogen, helium, or argon is used as a carrier gas.

The apparatus shown in FIG. 1 was used as a deposition apparatus, and the deposition conditions were varied such that D=3 to 10 mm, a temperature of the heating block 30 was 300 to 700° C., and a total gas pressure was 0.1 to 5 Torr. Selective growth of tungsten is caused by a silicon reduction reaction at an initial stage of growth, but it is promoted by a hydrogen reduction reaction when a film thickness is increased. Therefore, in order to deposit a thick film, hydrogen must be used as a carrier gas.

Typical deposition conditions were such that D=5 mm, a temperature of the heating block was 450° C., the total gas pressure was 0.5 Torr, and a partial pressure of tungsten hexafluoride was 0.05 Torr. Tungsten is sometimes selectively deposited or nonselectively deposited on an entire surface of a wafer in accordance with a purpose. The degree of selectivity depends on adsorption energy of the source gas or activation energy of nucleus generation based on the degree of supersaturation. Therefore, when the apparatus shown in FIG. 2 is used to arbitrarily select temperatures of the substrate 28 and the heating block 30, a film can be deposited with high selectivity or can be deposited on an entire surface.

Molybdenum can be deposited under substantially the same conditions as those in the case of tungsten except that molybdenum hexafluoride is used as a source gas. In addition, molybdenum pentachloride may be used as a source gas.

Silicide such as tungsten silicide or molybdenum silicide may be deposited by mixing a silane gas under the deposition conditions of a pure metal described above.

Polysilicon can be deposited using a silane gas as a source gas at a temperature of the heating block 30 of 700 to 1,100° C. When amorphous silicon is deposited, a temperature of the heating block is preferably further decreased. If disilane is used as a source gas, deposition can be performed even at 400° C. Amorphous silicon is widely used as a solar gas, and in such an application, a large amount of hydrogen is preferably contained in a film. According to the present invention, the substrate temperature can be suppressed low, so that amorphous silicon having a large amount of hydrogen and good characteristics can be formed.

As described above, the present invention can be applied to deposition of not only aluminum but also any metal or a semiconductor thin film, thereby realizing a thin film with good smoothness. In addition, in accordance with thin film formation applications, selectivity may be increased, or decreased so as to deposit on an entire surface, i.e., deposition conditions can be easily controlled. Furthermore, the present invention can be applied to a purpose of increasing a hydrogen content.

It is a matter of course that the present invention is not limited to the above embodiments but can be variously applied and modified.

[Embodiment 6]

Figure 12:
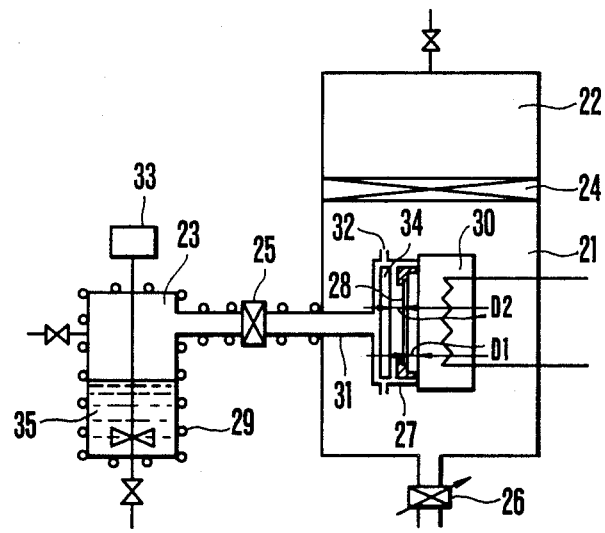
FIG. 12 is a schematic view showing a basic arrangement of a CVD apparatus according to still another embodiment of the present invention.

FIG. 12 shows still another embodiment of the present invention, in which the same parts as in FIG. 1 are denoted by the same reference numerals. In an apparatus shown in FIG. 12, a heating block 34 is disposed by a predetermined distance at a side of a substrate holder 27 opposing to a heating block 30, i.e., at a side of a cylindrical pipe 31, in addition to the elements of FIG. 1.

Each of the two heating blocks 30 and 34 and the substrate holder 27 has a moving mechanism, and an interval between the two heating blocks 30 and 34, an interval D1 between the heating block 30 and the wafer substrate 28, and an interval D2 between the heating block 34 and the wafer substrate 28 can be arbitrarily varied. The variable range of the intervals D1 and D2 is about 2 to 30 mm.

Although FIG. 12 relates to a basic arrangement of the apparatus, FIGS. 13 and 14 show an apparatus for mass production in more detail.

In FIGS. 13 and 14, reference numeral 121 denotes a main chamber; 122 to 124, reaction chambers; 125, a load lock chamber; 126, a rotary disk; 127, a motor; 128, a wafer holding plate; 129, a ring plate; 130, a lower dome; 131, a vacuum partition wall; 132, a rotary vacuum pump; 133, a valve; 134, a leak valve; 135, an upper matching box; 136, a lower matching box; 137, a spring; 138, an upper dome; 29a, a heater; and TC, a temperature detector such as a thermoccuple. Note that in FIG. 14, the same parts as in FIG. 1 are denoted by the same reference numerals.

As shown in a planar block diagram of FIG. 13, the cylindrical main chamber 121 has three reaction chambers 122, 123, and 124, and the load lock chamber 125, and these four sub chambers are vacuum-separated or differentially exhausted from the main chamber 121 during deposition or etching.

As shown in FIG. 14, the large rotary disk 126 is held in the main chamber 121, and four wafers are simultaneously transferred by rotation of the rotary disk 126 driven by the motor 127. During wafer transfer, all the main and sub chambers 121 to 125 are temporarily vacuum-connected to be in a high vacuum. The rotary disk 126 is of a horizontal type in FIG. 14, but it may be of a vertical type which rotates on a vertical plane. The vertical type disk is superior in maintenance of the reaction chambers The wafer substrate 28 is placed at the substrate holder 27 in the load lock chamber 22 so that a surface to be deposited thereof faces downward. A method of transferring a wafer between atmosphere and vacuum have various types, and any type may be used. For example, as shown in FIG. 14, a periphery of the substrate holder 27 may be pressed by double 0-rings to separate atmosphere from vacuum. When the wafer substrate 28 in the atmosphere is inserted in the load lock chamber 22, the wafer holding plate 128 is moved upward while the the ring plate 129 is pressed against the substrate holder 27 as shown in FIG. 14. Then, utilizing a vacuum or electrostatic chuck, the wafer substrate 28, the surface to be deposited of which faces downward, is chucked to the wafer holding plate 128. Thereafter, the wafer holding plate 128 is moved downward to press the ring plate against the substrate holder 27, thereby separating the load lock chamber 22 from the outside. In this state, the wafer substrate 28 with respect to the wafer holding plate 128 is released to move the wafer substrate 28 toward the substrate holder 27, and then the rotary vacuum pump 132 and the valve 133 are operated to reduce a pressure in the load lock chamber 22. Finally, the wafer holding plate 128 and the ring plate 129 are moved upward in association with each other. As a result, the load lock chamber 22 is vacuum-connected to the main chamber 121, and at the same time, the spring connecting the substrate holder 27 with the rotary disk 126 contracts, so that the rotary disk 126 can rotate.

On the contrary, when the wafer substrate 28 is removed from the main chamber 121 to the atmosphere, the wafer holding plate 128 and the ring plate 129 are moved downward in association with each other to press the periphery of the substrate holder 27, thereby separating the main chamber 121 from the load lock chamber 22. Thereafter, the leak valve 134 is opened to obtain an atmospheric pressure in the load lock chamber 22. When only the wafer holding plate 128 is moved upward with the ring plate 129 fixed, the wafer substrate 28 can be removed.

Figure 15A:
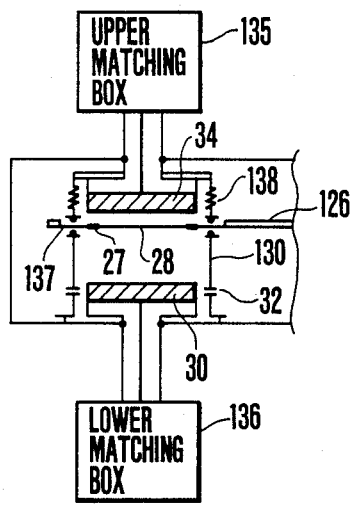
FIGS. 15a to 15d are schematic views showing operation modes of reaction chambers in the apparatus of FIG. 14.
Figure 15B:
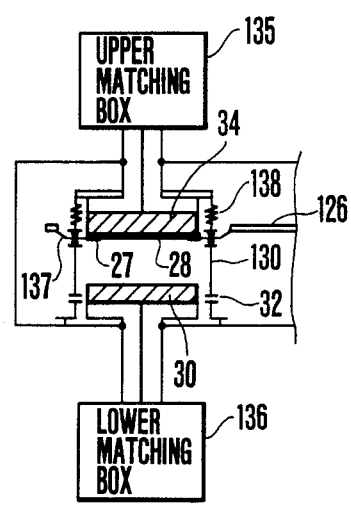
Figure 15C:
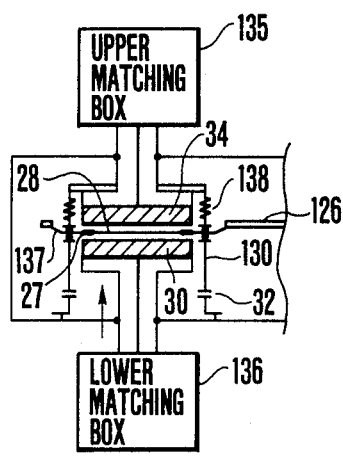

FIGS. 15a to 15d show operation modes of the reaction chambers, in which the same or corresponding parts as in FIG. 14 are denoted by the same reference numerals. As shown in FIG. 15a, when the wafer substrate 28 is transferred, the substrate holder 27 connected to the rotary disk 126 &through the spring 137 is released from locking in the reaction chamber and hence can freely rotate. At this time, the two heating blocks 30 and 34 sandwiching the wafer substrate 28 therebetween are already heated up to a predetermined temperature. After the wafer substrate 28 is placed in the reaction chamber, the upper dome 138 of the reaction chamber presses the periphery of the substrate holder 27 to vacuum-separate the interior of the reaction chamber from the main chamber 121. At this time, the heating block 34 moves to contact the wafer substrate 28. Subsequently, in order to clean the substrate surface before deposition, a gas such as Ar is supplied in the reaction chamber, and at the same time, an RF (Radio Frequency) is applied to the wafer substrate 28 by the upper matching box 135, thereby performing sputter-etching. Then, the two heating blocks 30 and 34 sandwiching the wafer substrate 28 move and stop at a predetermined position near the wafer substrate 28, as shown in FIG. 15c. In this state, a triisobutyl aluminum gas is supplied to selectively deposit aluminum.

Figure 15D:
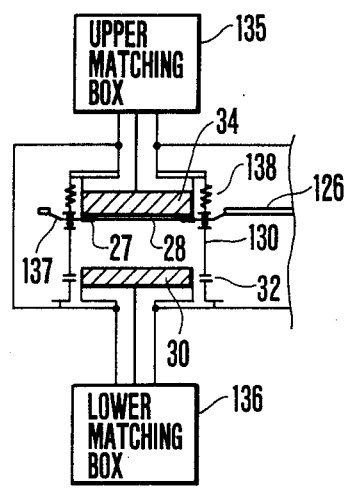

In addition to the above modes, an RF (Radio Frequency) may be applied to the heating block 30 by the lower matching box 136 as shown in FIG. 15d, thereby realizing plasma CVD. Furthermore, in either of FIGS. 15c and 15d, a source gas may be changed to deposit a metal such as W, Ti, Cr, or Si other than Al.

Applications of the apparatus shown in FIGS. 13, 4, and 15a to 15d are exemplified in the following table in detail.

In filling (three wafers at a time), the three reaction chambers are all used to selectively deposit aluminum, so that aluminum can be deposited on three substrates at the same time. Therefore, since the throughput can be increased, this method can be used to fill a via hole or to enclose silicon with aluminum.

TABLE

|  | Reaction Chamber 122 | Reaction Chamber 123 | Reaction Chamber 124 |
| --- | --- | --- | --- |
| Filling (Three Wafers at a Time) | Selective Al Growth | Selective Al Growth | Selective Al Growth |
| Entire Surface Deposition (Two Wafers at a Time) | Nonselective Metal Growth | Selective Al Growth | Selective Al Growth |
| Two-Step | Selective | Nonselective | Selective |

TABLE-continued

| | Reaction Chamber 122 | Reaction Chamber 123 | Reaction Chamber 124 |
|---|---|---|---|
| Deposition (One by One) | Al Growth | Metal Growth | Al Growth |

In entire surface deposition (two wafers at a time), nonselective metal growth is performed, i.e., a metal such as Ti, Si, or W is deposited on an entire surface to form a thin metal film in the reaction chamber 122, and then aluminum is selectively grown in the reaction chambers 123 and 124. Since aluminum is deposited on the entire surface, an underlying metal can be used as a barrier between aluminum and substrate Si. In this entire surface deposition, selective Al growth is performed twice with two substrates at a time because a time of metal nonselective growth is shorter than a time of Al selective growth.

In two-step deposition (one by one), the above two cases are combined. That is, aluminum is selectively grown in the reaction chamber 122, a metal is then nonselectively grown in the reaction chamber 123, and finally, aluminum is selectively grown in the reaction chamber 124. In this case, the via hole is filled by the first selective growth, and then aluminum is grown on the entire surface to obtain a flat surface.

In addition to the above modifications, variations are proposed such that aluminum is deposited in the reaction chamber 124 and subsequently a metal is nonselectively grown in the same reaction chamber. As for substrate etching before deposition, a substrate is preferably etched after the wafer substrate is moved into the reaction chamber and immediately before deposition. The reaction chamber 122 may be used as a special etching chamber, so that the wafer is etched therein and then transferred to the reaction chambers 123 and 124 and deposited therein. However, in this case, a time interval from etching to deposition should not be increased.

A description will be made with reference to the case wherein aluminum is selectively grown using the above CVD apparatus. In this case, the same steps as shown in FIGS. 3a to 3e are used.

The steps are the same as in the above embodiment as far as the natural oxide film layer 44 is removed.

Then, the wafer substrate 47 subjected to the pretreatment shown in FIG. 3c is set in the load lock chamber 22, and the chamber is sufficiently evacuated. Subsequently, the wafer substrate 47 (28) is moved to the deposition chambers 122 to 124 and held between the two heating blocks 30 and 34 within a few minutes, thereby obtaining a constant temperature of the wafer substrate 47. At this time, an inert gas such as argon may be flowed around the wafer to heat the wafer substrate 47 more effectively.

Subsequently, the valve 25 between the source chamber 23 and the deposition chamber in which the wafer substrate is mounted is opened to supply the source gas into the deposition chamber, thereby starting deposition of aluminum. Note the source chamber 23 is preferably evacuated at a flow rate substantially the same as that during deposition for a proper time interval until the valve 25 is opened so that a pressure in the deposition chamber is largely varied immediately after the valve 25 is opened. When a predetermined deposition time has passed, the valve 25 between the source chamber 23 and the deposition chamber is closed to complete deposition. By the above operation, aluminum 45 can be selectively deposited in only the opening portion 43 of the silicon substrate 41.

Film deposition conditions must be carefully chosen to selectively deposit aluminum 45 with good smoothness only on silicon in the opening portion 43. Especially, temperatures of the two heating blocks 30 and 34, and intervals D1 and D2 between the two heating blocks and the wafer substrate 28 (47) are important parameters. When, D1=D2=5 mm, a gas flow rate was about 20 to 30 cc/min, a pressure of the source gas in the deposition chambers 122 to 124 was 0.5 Torr, and a pressure in the main chamber 121 was about 0.05 Torr, an aluminum film was deposited on silicon as shown in FIG. 16. In FIG. 16, the abscissa represents a temperature TD of the heating block 30 facing to the substrate surface to be deposited, and the ordinate represents a temperature TB of the heating block 34 facing to the rear surface of the substrate. Deposition of aluminum does not progress unless the temperature of the heating block is increased to some extent. Therefore, a boundary between a region where aluminum is not deposited and a region where aluminum is deposited is called a "deposition boundary" in this description. As a result of experimentally checking the deposition boundary, it is represented by a straight line S1 of about TD+TB=C where C is a constant when distances D1 and D2, a pressure of the source gas, and the like are fixed, and was about 460 to 480° C. in this condition. In FIG. 16, in a region above the deposition boundary, a deposition rate increases as a value of TD+TB increases, and at the same time, a film thickness distribution changes such that a thickness around the wafer substrate is increased. In addition, as the value of TD+TB increases, surface roughness of a deposited aluminum film is enlarged. Furthermore, at a higher temperature, island-like aluminum nuclei start to be formed on a silicon dioxide film, i.e., aluminum is nonselectively deposited on both silicon and the silicon dioxide film.

In FIG. 16, a region on a straight line S2 of TB =TD is in the same state as that of conventional hot wall type CVD since peripheral wall surfaces of the wafer substrate are all heated up to identical temperatures. In the hot wall type, an entire quartz pipe in which a deposition substrate is placed is heated by a heater. In this case, the source gas is heated up to the same temperature as that of the quartz pipe while flowing therethrough. Therefore, in the hot wall type, the temperature of the source gas is substantially the same as the substrate temperature. On the other hand, an entire region of TB >TD (region above the straight line TB=TD as a boundary in this graph) is in the same state as that of conventional cold wall type CVD since the rear surface of the wafer substrate is heated up to a high temperature and a wall surface opposing the front surface is at a low temperature. In the cold wall type, the deposition substrate is fixed to the substrate heater in tight contact therewith and a source gas at a temperature lower that the substrate temperature is supplied.

Unlike such conventionally used CVD methods, CVD according to the present invention is characterized in that a completely new region of TB≦TD (below the straight line S2 as a boundary in the graph) can be used. Under such a condition, since the temperature of the source gas is higher than the substrate temperature immediately before deposition, the source gas on the substrate surface is brought into a highly supersaturated state, or the substrate temperature can be kept at a low temperature, thereby obtaining a smooth and good aluminum film. A region S3 shown by a broken line in FIG. 16 represents a region where a good aluminum film can actually be obtained, so that it can be assumed that the above-mentioned state is realized therein. The region S3 is also a region where a film thickness of the aluminum film deposited on the wafer substrate is substantially uniform.

Figure 17:
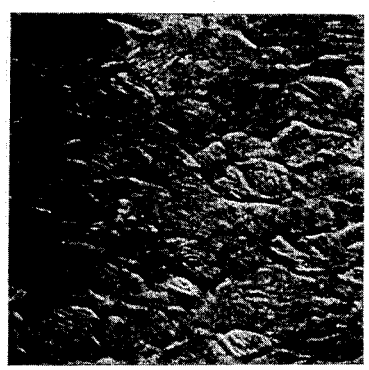
FIG. 17 is a photograph of a metal texture of aluminum deposited on a silicon substrate by the method according to the present invention.

FIG. 17 shows a photograph of a metal texture of aluminum obtained when TD=320° C. and TB=200° C. Although several reports have been made with respect to deposition of aluminum by CVD (but not associated with selective growth), either of surfaces of films deposited by these reported methods has a group of small crystal grains with large surface roughness, and gaps are partially formed between the grains, as shown in FIG. 11. On the contrary, according to CVD of the present invention, a surface is smooth with a large grain size, and no gap is formed between grains, as shown in FIG. 17. A state of the metal texture changes in accordance with, e.g., whether a material of a deposition substrate is silicon or aluminum. For example, when aluminum is deposited on a (111) silicon substrate, a large grain boundary shown in FIG. 17 is not formed. However, also in this case, a surface is smooth and no gap is formed between grains, i.e., a good film is formed. In addition, a region where such a film is obtained is a wide region along the straight line S1 of TD TB=C. Therefore, by changing the temperature TD of the heating block 30 or the temperature TB of the heating block 34, a good film can be obtained with high controllability and reproducibility. Thus, the present invention is highly practical even if it is applied to a mass production apparatus for manufacturing a thin film.

Either of aluminum films deposited in regions other than the region S3 represented by the broken line has problems of large surface roughness, poor uniformity, and the like. In addition, when TD+TB=600° C. or more, it is difficult to obtain selectivity. Note that the region S3 represented by the broken line is not quantitatively fixed but varies in accordance with conditions such as a pressure or a flow rate of a source gas. Therefore, the region S3 represents only its tendency.

The reason why the deposition boundary is represented by the straight line S1 substantially of TD+TB=C will be described below. As is apparent from an interval between the wafer substrate and the heating blocks and a pressure of a source gas, a state of source gas during deposition is in a viscous flow region. Therefore, in this case, a temperature profile between the heating blocks substantially linearly changes, e.g., a temperature of the wafer substrate separated from the two heating blocks by an equal distance is (TD+TB)/2. On the other hand, the deposition boundary shown in FIG. 16 represents that film deposition starts when a value of TD+TB becomes a given constant C. Therefore, since the temperature of the wafer substrate is (TD+TB)/2 as described above, it is found that progress of film deposition is mainly determined by the wafer substrate temperature. Note that in the region of TB<TD, an inclination of the deposition boundary is slightly larger than that of the straight line of TD+TB=C. Therefore, it can be assumed that the source gas temperature secondarily affects progress of film deposition in addition to the substrate temperature.

The experiment described above was conducted under a condition of D1=D2=5 mm. However, even when D1 and D2 varies, the deposition boundary can be roughly expected by calculating the wafer substrate temperature. When the interval between the two heating blocks is maintained constant and the wafer substrate 47 (28) is moved toward the heating block 30 at the temperature TD, an inclination of the deposition boundary is abruptly increased and ultimately becomes a vertical line (TD=C/2) when D1=0 mm. On the other hand, when the wafer substrate 47 is moved toward the heating block 34 at the temperature TB, the inclination of the deposition boundary is decreased and ultimately becomes a horizontal line (TB=C/2) when D2=0 mm. At this time, the center of rotation of the deposition boundary is an intersection of the straight lines TD+TB=C and TB=TD. Thus, along with movement of the deposition boundary, a range of conditions under which a good film can be deposited varies. In addition, when the variable range of D1 and D2 is about 3 to 15 mm or less, a sufficiently good film can be deposited. Therefore, a practical minimum interval is determined by manufacturing accuracy of the heating blocks or position control accuracy of the wafer substrate, and a maximum interval is limited by degradation in uniformity of a deposited film caused by a peripheral effect. The peripheral effect is a phenomenon in which when an interval between the two heating blocks 30 and 34 is large, a mixture with a gas other than that heated on the heating surface occurs around the heating blocks so that a thickness or quality of a film deposited on a periphery of the wafer substrate is not uniformed.

In the structure wherein the wafer substrate 28 contacts the heater 34 (D2=0 mm) as shown in FIG. 2 of the first embodiment, the deposition boundary becomes a straight line of TB=C/2=230 to 240° C. in FIG. 16, and the conditions under which a good film is formed is limited to those in which TB is around 250 to 260° C. A technique is required to narrow the temperature profile of a heater for heating a substrate (in this case, the heating block at the rear side of the wafer substrate), and even if the heater temperature is uniform, a relatively wide temperature profile occurs in the wafer substrate in accordance with a degree of contact between the heater and the wafer substrate. Therefore, it is not easy to keep uniformity of a thickness or quality of a deposited film by a conventional apparatus in which the heater is brought into contact with the wafer substrate. When the heating block is separated from the wafer substrate (D2>0 mm), a heat conductivity in the wafer substrate is much larger than that of a gas and the wafer substrate is heated by a gas, a temperature of which is uniformed. As a result, the temperature of the wafer substrate is extremely uniformed.

When a pressure of the source gas is decreased and a state of gas becomes a molecular flow, the temperature of the wafer substrate is represented by a geometric average of the temperatures of the two heating blocks. In addition, a spatial temperature profile no longer has linearity with respect to a distance, a situation changes from that described above. However, since the wafer substrate temperature or the temperature profile between the heating blocks can be easily obtained, the deposition condition can be roughly expected.

As described above, since the conditions under which a good film is deposited change in accordance with a distance between the heating blocks and the wafer substrate, a gas pressure, and the like, all of these conditions cannot be described here. However, since a basic concept is clear, an individual condition can be determined in accordance therewith.

In this embodiment, as a result of measuring the wafer substrate temperature during deposition using a thermocouple, it is found that the substrate temperature increases at the same time the source gas is flowed to start deposition and reaches substantially a constant temperature within one to two minutes. When an inert gas such as argon is flowed before the source gas is flowed, the constant or steady temperature is obtained earlier.

The source gas is heated up to a high temperature by the heating block 30 and activated, and then the source gas in a decomposition state reaches the substrate 28 at a lower temperature. It is difficult to know how the source gas on the substrate 28 is decomposed, but it can be assumed that in this state, aluminum on the substrate 28 is relatively highly supersaturated as compared with conventional CVD. In this case, according to the nucleus growth theory, a change in volume energy during generation of clusters is increased, and the activation energy G* of generation of stable nuclei is decreased and the number density n* of critical nuclei is increased, as is apparent from the equations (3) and (4). Therefore, an average nucleus radius when they coalesce with each other is decreased, thereby forming a smooth film with small surface roughness.

The characteristics of a good film deposition process according to the deposition method of the present invention can be clearly known by scanning electron microscopic observation. Under conditions such that the apparatus shown in FIG. 12 was used and a wafer substrate was placed at the center of two heating blocks at a distance of D1=D2=5 mm, an Al film was deposited using conditions of points A and B shown in FIG. 16. The point A is a condition for depositing a good film in which TD=320° C. and TB=200° C., e.g., the source gas temperature is higher than the substrate temperature. The point B is a condition for comparison in which TD=200° C. and TB=320° C, i.e., the source gas temperature is lower than the substrate temperature. Since the source gas is in a viscous flow state and a heat conductivity of the wafer substrate is much larger than that of the gas, it can be assumed that the substrate temperatures at the points A and B are substantially equal to each other, i.e., about 260° C.

Figure 18A:
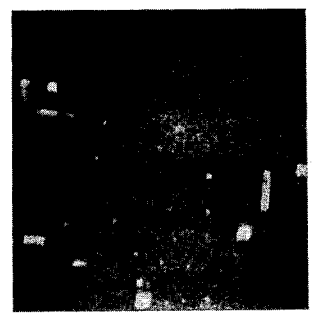
FIGS. 18a to 18d and 19a to 19d are photographs of a metal texture showing an initial period of aluminum growth.
Figure 18B:
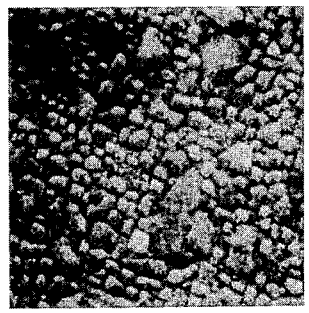
Figure 18C:
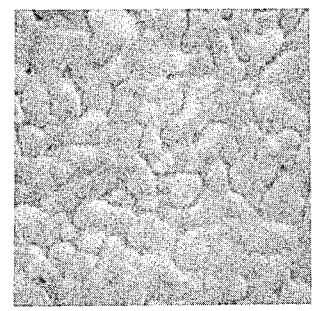
Figure 18D:
Figure 19A:
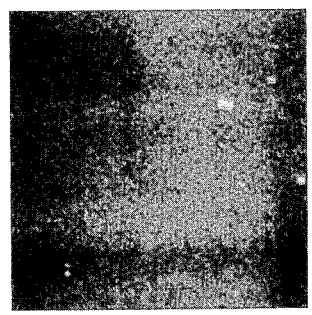
Figure 19B:
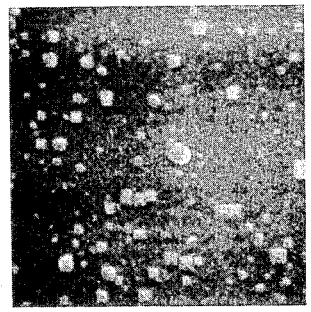
Figure 19C:
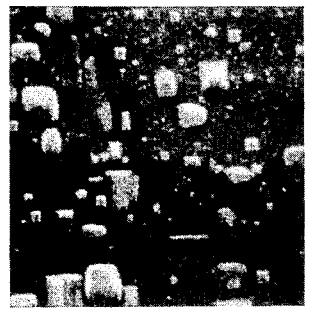
Figure 19D:
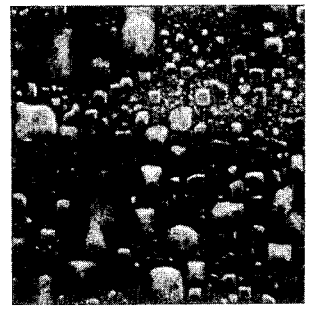

FIGS. 18a to 18d and FIGS. 19a to 19d are photographs of a metal texture showing a process of growing an Al film when an Al film is deposited under these conditions, in which FIG. 18a to 18d show a sample A, and FIGS. 19a to 19d show a sample B. As shown in FIGS. 18a to 18d, according to the sample A deposited at the point A which is the condition wherein the source gas temperature is higher than the substrate temperature, grown nuclei with high density are generated within two minutes after deposition is started (FIG. 18b). Since intervals between nuclei are small, coalescence of nuclei progresses within three minutes (FIG. 18c), and a smooth and continuous film is obtained within 5 minutes (FIG. 18d). Note that FIG. 18a shows a state one minute after deposition is started.

On the other hand, according to the sample B deposited at the point B where the gas temperature is lower than the substrate temperature, as is apparent from states one, two, three, and five minutes after deposition is started respectively shown in FIGS. 19a, 19b, 19c, and 19d, a nucleus density is not so much increased even when a deposition time increases, and only island growth mainly progresses and almost no coalescence occurs in a deposition time within five minutes. For this reason, an Al film with large surface roughness is obtained. Similarly, island growth progresses in the region of TB>TD in addition to the point B.

As described above, in the deposition method according to the present invention, it can be assumed that since the heated source gas reaches the substrate at a lower temperature, the gas on the substrate surface is highly supersaturated to generate nuclei with high density, thereby obtaining a smooth film. In addition, it is confirmed that the nuclei exhibit the same behavior as the result of the nucleus growth theory by Volmer et al. using a surface free energy model.

According to this embodiment, the source gas itself is heated by the two heating blocks 30 and 34 so as to have a constant spatial temperature distribution, and the deposition substrate placed therebetween is heated by the source gas. For this reason, as compared with the conventional cold wall type CVD method, reproducibility and uniformity of film deposition are significantly improved.

By the aluminum deposition operation described above, aluminum can be selectively deposited only in the via hole 43 as a silicon opening portion, as shown in FIG. 3d. The deposition conditions of this embodiment are such that D1=D2=5 mm, a gas flow rate was about 20 to 30 cc/min, a pressure of the source gas in either of the deposition chambers 122 to 124 was 0.5 Torr, a pressure in the main chambers 121 was about 0.05 Torr, TD=320° C., and TB=200° C. A film thickness of aluminum in the via hole 43 is 5,000 Å which is the same thickness as that of the silicon dioxide film, thereby obtaining a flat shape. An aluminum film deposited by the conventional cold wall type CVD has no problem in terms of an impurity in a film since it is below detection limit of Auger analysis. However, its resistivity is as slightly high as 3.3 $\mu\Omega$-cm, and surface roughness of the film is large as shown in FIG. 11. Therefore, this aluminum film is not suitable for a micropattern. This is because island formation occurs at an initial period of film growth and then these islands are linked to form a film. Surface roughness of the film is largely affected by a heating temperature of the substrate during deposition, and when the substrate temperature is decreased, surface roughness is reduced. However, in the conventional methods, even when a film is deposited under the best conditions, it is inferior to those deposited by another deposition method such as sputtering or vacuum evaporation in terms of surface roughness.

In the present invention, a smooth film can be formed by using two heating blocks opposing each other, as described above. In addition, when a film thickness is 1,000 Å or more, resistivity of 2.9 $\mu\Omega$-cm, i.e., near the bulk value can be obtained, and even when a film is as thin as 500 Å, the film exhibits conductivity. Therefore, it is found that a continuous aluminum film is obtained.

FIG. 3e shows a state wherein aluminum 45 having the same thickness as that of the silicon dioxide film 42 is selectively deposited in the silicon opening portion 43 and then the aluminum film 46 is deposited on an entire surface by conventional sputtering. FIG. 3e also shows a sectional shape of the silicon opening portion obtained when an aluminum wiring pattern is formed by pattern formation.

As described above, CVD using the two heating blocks 30 and 34 is characterized in that an aluminum film with a smooth surface and a large grain size can be deposited with good reproducibility, uniformity, and selectivity. For this reason, the via hole can be filled to realize a flat multilayer wiring.

In the above embodiment, the description has been made with reference to only triisobutyl aluminum. However, another organic compound of aluminum such as trimetyl aluminum or trietyl aluminum may be used as a source gas. In this case, since their chemical characteristics are the same as that of triisobutyl aluminum, aluminum can be deposited on a substrate in the same manner as described above by changing the deposition conditions to some extent.

[Embodiment 7]

An embodiment of a CVD apparatus shown in FIGS. 13 to 16 according to the present invention will be described below. In this embodiment, triisobutyl aluminum and disilane are used to deposit an aluminum alloy containing silicon. In the sixth embodiment shown in FIGS. 3c to 3e, an aluminum film containing 1 to 2% of silicon is deposited using organic aluminum and a silane gas instead of depositing pure aluminum. This embodiment corresponds to the second embodiment. For example, the apparatus shown in FIG. 12 is used, a temperature of the heating block 30 is set to be about 600° C., and that of the heating block 34 is set to be about 200° C. In this case, an aluminum film can be deposited by decomposition of silane gas. However, since a decomposition temperature of silane is largely different from a decomposition temperature of triisobutyl aluminum, it is difficult to obtain decomposition conditions with good uniformity. Such a problem is eliminated by using disilane instead of silane, so that an aluminum film containing silicon can be easily deposited.

In the apparatus shown in FIG. 12, $D1=D2=5$ mm, $TD=360°$ C., and $TB=150°$ C. Disilane was flowed at 30 cc/min, and other conditions such as a flow rate of triisobutyl aluminum were the same as those of the sixth embodiment. Note that a pressure of gas in the deposition chamber 21 was as slightly high as 0.8 Torr since it was a sum of partial pressures of two gases. Under these conditions, concentration of silicon in aluminum was about 2%. As an experimental result, when only disilane was flowed and triisobutyl aluminum was not flowed at all, the temperature of the heating block 30 had to be set at 400° C. or more to decompose disilane to deposit silicon on the substrate. However, when disilane and triisobutyl aluminum were flowed at the same time, silicon was doped in the aluminum film at a lower temperature, and it was found that silicon of a percent order was contained at about 350° C. or more. When the temperature TD is increased, decomposition of disilane is promoted, and concentration of silicon in aluminum is abruptly increased. Therefore, concentration of silicon can be arbitrarily changed by controlling the temperature of the heating blocks or the flow rate of disilane.

As described above, in CVD using the heating blocks 30 and 34, when triisobutyl aluminum and disilane are used as source gases, aluminum containing an arbitrary amount of silicon can be deposited.

In this method, silicon-containing aluminum is selectively grown, but it can be deposited on an entire surface regardless of materials of an underlying substrate. Since such as nonselective growth method has been described above with reference to the second embodiment, a detailed description thereof will be omitted.

[Embodiment 8]

In this embodiment, the CVD apparatus shown in FIGS. 12 to 15d is used to selectively deposit aluminum on a gate electrode, a source, and a drain of a MOSLSI, thereby decreasing a resistance.

In this case, the steps shown in FIGS. 9a to 9j of the third embodiment are used. A difference of this embodiment from the third embodiment is that in FIG. 9g, deposition of aluminum is performed using the apparatus shown in FIG. 12 under the standard conditions such that $D1=D2=5$ mm, $TD=320°$ C., $TB=200°$ C., and a pressure of the source gas is 0.5 Torr, and aluminum having a film thickness of about 1,000 Å is formed for a deposition time of about 10 minutes.

An effect of the structure obtained by this embodiment is the same as that of the third embodiment.

[Embodiment 9]

In this embodiment, the apparatus shown in FIGS. 12 to 15d is used to form an electrode of a bipolar LSI and a resistive body using polysilicon.

In this case, steps shown in FIGS. 10a to 10e of the fourth embodiment are used. A difference of this embodiment from the fourth embodiment is that in FIG. 10b, deposition of aluminum is performed using the apparatus shown in FIG. 12 under the standard conditions such that $D1=D2=5$ mm, $TD=320°$ C., $TB=200°$ C., and a pressure of the source gas is 0.5 Torr, and aluminum having a film thickness of about 1,000 Å is formed for a deposition time within about 10 minutes.

An effect of the structure obtained by this embodiment is the same as that of the fourth embodiment.

[Embodiment 10]

The CVD apparatus shown in FIGS. 12 to 15d can be effectively used to chemical vapor deposition of a metal other than aluminum or a semiconductor. For example, when the present invention is used to deposition and, more particularly, to selective growth of tungsten or molybdenum, a smooth and good film can be deposited. In the case of tungsten, tungsten hexafluoride is used as a source gas, and hydrogen, helium, or argon is used as a carrier gas. In this case, the deposition apparatus shown in FIG. 12 is used, and the deposition conditions are varied such that $D1=3$ to 10 mm, $D2=3$ to 10 mm, $TD=300$ to 700° C., $TB=200$ to 600° C., and a total gas pressure is 0.1 to 5 Torr. Selective growth of tungsten is caused by silicon reduction reaction at an initial period of growth, but it is promoted by hydrogen reduction reaction when a film thickness is increased. Therefore, in order to deposit a thick film, hydrogen must be used as a carrier gas.

Typical deposition conditions were such that $D1=D2=5$ mm, $TD=450°$ C., $TB=300°$ C., a total gas pressure was 0.5 Torr, and a partial pressure of tungsten hexafluoride was 0.05 Torr. In accordance with purposes, tungsten is selectively deposited or nonselectively deposited on an entire surface. A degree of selectivity depends on an adsorption energy of the source gas or an activation energy of nuclear generation based on a degree of supersaturation. Therefore, when the apparatus shown in FIGS. 12 to 15d is used to arbitrarily select temperatures of the two heating blocks, a film can be highly selectively deposited or deposited on an entire surface.

Molybdenum can be deposited under substantially the same conditions as those in the case of tungsten except that molybdenum hexafluoride is used as a source gas. In addition, molybdenum pentachloride may be used as a source gas.

Silicide such as tungsten silicide or molybdenum silicide can be deposited by mixing a silane gas under the above deposition conditions for a pure metal.

Polysilicon can be deposited using a silane gas and the like as a source gas at TD and TB of 400 to 1,100° C. When amorphous silicon is deposited, temperatures of the heating blocks are preferably further decreased. If disilane is used as a source gas, amorphous silicon can be deposited at TD=400° C. Amorphous silicon is generally widely used as a solar cell, and when it is used in such an application, a large amount of hydrogen is preferably contained in a film. In this embodiment, since the substrate temperature can be decreased to a low temperature, good amorphous silicon with a large content of hydrogen can be deposited.

As has been described above, when the method of CVD apparatus according to the present invention is applied to deposition of not only aluminum but also any metal or semiconductor, a thin film with good smoothness can be realized. In addition, the deposition conditions can be easily controlled such that selectivity is increased in accordance with applications of film formation, or decreased to deposit a film on an entire surface. Furthermore, the present invention can be applied to a purpose of increasing a hydrogen content in deposited films.

What is claimed is:

1. A chemical vapor deposition method comprising the steps of
   (a) spacing apart from a first heating block, but proximate to and in a closed space, a film deposition surface of a substrate, said heating block having a heating surface;
   (b) maintaining the spacing of said deposition surface equidistant from the opposed surface of said first heating block;
   (c) maintaining a temperature of said substrate within a temperature range higher than a deposition start temperature and lower than a temperature at which a thickness distribution occurs such that a thickness of a peripheral portion of said substrate is larger than that of a central portion of said substrate;
   (d) guiding a source gas into said closed space and between said substrate and said heating surface; and
   (e) depositing a thin film on said film deposition surface of said substrate by a thermal reaction of the source gas heated to a temperature higher than the temperature of said substrate.

2. A method according to claim 1, wherein the source gas contains at least an organic compound of aluminum.

3. A method according to claim 1, wherein the source gas is a gas selected from the group consisting of tungsten hexafluoride, molybdenum hexafluoride, a gas mixture of tungsten hexafluoride or molybdenum hexafluoride and a silane gas, molybdenum pentachloride, and a gas containing a silane gas or a disilane gas.

4. A method according to claim 1, wherein said surface of said substrate is made of at least one material selected from the group consisting of a conductor and a semiconductor, and an insulator, the source gas contains a compound of metal, and the source gas contains a compound of metal, and the source gas is guided between said first heating block and said surface of said substrate, thereby selectively depositing a thin metal film only on a portion of said surface of said substrate made of a conductor or a semiconductor.

5. A method according to claim 4, wherein the source gas contains at least an organic compound of aluminum.

6. A method according to claim 4, wherein the source gas is a gas selected from the group consisting of tungsten hexafluoride, molybdenum hexafluoride, a gas mixture of tungsten hexafluoride or molybdenum hexafluoride and a silane gas, molybdenum pentachloride, and a gas containing a silane gas or a disilane gas.

7. A method according to claim 1, wherein a second heating block is arranged at a side opposite to said first heating block with respect to said substrate at a given distance and is controlled to have a lower temperature than that of said first heating block.

8. A method according to claim 7, wherein the source gas contains both at least an organic aluminum compound gas and a silicon hydrogen compound gas.

9. A method according to claim 1, further including the step of cleaning said surface to be deposited of said substrate before a film is deposited.

10. A method according to claim 1, wherein a substrate heater is maintained at a lower temperature than that of said heating surface of said block is disposed behind said substrate.

* * * * *